United States Patent
Haba et al.

(10) Patent No.: US 7,453,157 B2
(45) Date of Patent: Nov. 18, 2008

(54) MICROELECTRONIC PACKAGES AND METHODS THEREFOR

(75) Inventors: Belgacem Haba, Cupertino, CA (US);
Masud Beroz, Livermore, CA (US);
Teck-Gyu Kang, San Jose, CA (US);
Yoichi Kubota, Pleasanton, CA (US);
Sridhar Krishnan, Campbell, CA (US);
John B. Riley, III, Dallas, TX (US);
Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/140,312

(22) Filed: May 27, 2005

(65) Prior Publication Data

US 2005/0285246 A1 Dec. 29, 2005

Related U.S. Application Data

(60) Provisional application No. 60/583,066, filed on Jun. 25, 2004, provisional application No. 60/621,865, filed on Oct. 25, 2004.

(51) Int. Cl.
 *H01L 23/52* (2006.01)
 *H01L 23/48* (2006.01)
 *H01L 29/40* (2006.01)

(52) U.S. Cl. ............................. 257/785; 257/E23.065; 257/678; 257/746; 257/786; 174/52.2; 174/52.4; 361/760

(58) Field of Classification Search .......... 257/E23.135, 257/678, 675, 706, 713, E21.504, E23.046, 257/737, 738, E23.065, 23.068, E23.105, 257/E25.023, 746, 796, 784–786; 174/52.4, 174/52.2, 260; 361/760

See application file for complete search history.

(56) References Cited

U.S. PATENT DOCUMENTS

| | | | |
|---|---|---|---|
| 4,804,132 A | 2/1989 | DiFrancesco | |
| 4,975,079 A | 12/1990 | Beaman et al. | |
| 5,083,697 A | 1/1992 | Difrancesco | |
| 5,148,265 A | 9/1992 | Khandros et al. | |
| 5,148,266 A | 9/1992 | Khandros et al. | |
| 5,196,726 A | 3/1993 | Nishiguchi et al. | |
| 5,214,308 A | 5/1993 | Nishiguchi et al. | |
| 5,285,352 A * | 2/1994 | Pastore et al. | 361/707 |
| 5,329,423 A * | 7/1994 | Scholz | 361/760 |
| 5,361,491 A * | 11/1994 | Oomachi et al. | 29/852 |
| 5,455,390 A | 10/1995 | DiStefano et al. | |

(Continued)

*Primary Examiner*—Chris C. Chu
(74) *Attorney, Agent, or Firm*—Lerner, David, Littenberg, Krumholz & Mentlik, LLP

(57) ABSTRACT

A microelectronic package includes a microelectronic element having faces, contacts and an outer perimeter, and a flexible substrate overlying and spaced from a first face of the microelectronic element, an outer region of the flexible substrate extending beyond the outer perimeter of the microelectronic element. The package includes a plurality of etched conductive posts exposed at a surface of the flexible substrate and being electrically interconnected with the microelectronic element, wherein at least one of the conductive posts is disposed in the outer region of the flexible substrate, and a compliant layer disposed between the first face of the microelectronic element and the flexible substrate, wherein the compliant layer overlies the at least one of the conductive posts that is disposed in the outer region of the flexible substrate. The package includes an encapsulating mold material in contact with the microelectronic element and the compliant layer, whereby the encapsulating mold material overlies the outer region of the flexible substrate.

36 Claims, 28 Drawing Sheets

U.S. PATENT DOCUMENTS

| | | | | |
|---|---|---|---|---|
| 5,518,964 | A | 5/1996 | DiStefano et al. | |
| 5,594,275 | A * | 1/1997 | Kwon et al. | 257/686 |
| 5,659,952 | A | 8/1997 | Kovac et al. | |
| 5,679,977 | A | 10/1997 | Khandros et al. | |
| 5,802,699 | A | 9/1998 | Fjelstad et al. | |
| 5,870,289 | A * | 2/1999 | Tokuda et al. | 361/779 |
| 6,127,724 | A * | 10/2000 | DiStefano | 257/675 |
| 6,175,151 | B1 * | 1/2001 | Hashimoto | 257/676 |
| 6,177,636 | B1 | 1/2001 | Fjelstad | |
| 6,202,297 | B1 | 3/2001 | Faraci et al. | |
| 6,255,740 | B1 * | 7/2001 | Tsuji et al. | 257/792 |
| 6,340,793 | B1 * | 1/2002 | Yaguchi et al. | 174/539 |
| 6,545,228 | B2 * | 4/2003 | Hashimoto | 174/260 |
| 6,703,705 | B2 * | 3/2004 | Yamazaki et al. | 257/692 |
| 6,847,109 | B2 * | 1/2005 | Shim | 257/697 |
| 6,977,428 | B2 * | 12/2005 | Nakamura | 257/678 |
| 2002/0135065 | A1 * | 9/2002 | Zhao et al. | 257/738 |
| 2004/0222518 | A1 | 11/2004 | Haba et al. | |
| 2005/0116326 | A1 | 6/2005 | Haba et al. | |
| 2005/0173805 | A1 | 8/2005 | Damberg et al. | |
| 2005/0181544 | A1 | 8/2005 | Haba et al. | |
| 2005/0181655 | A1 | 8/2005 | Haba et al. | |

* cited by examiner

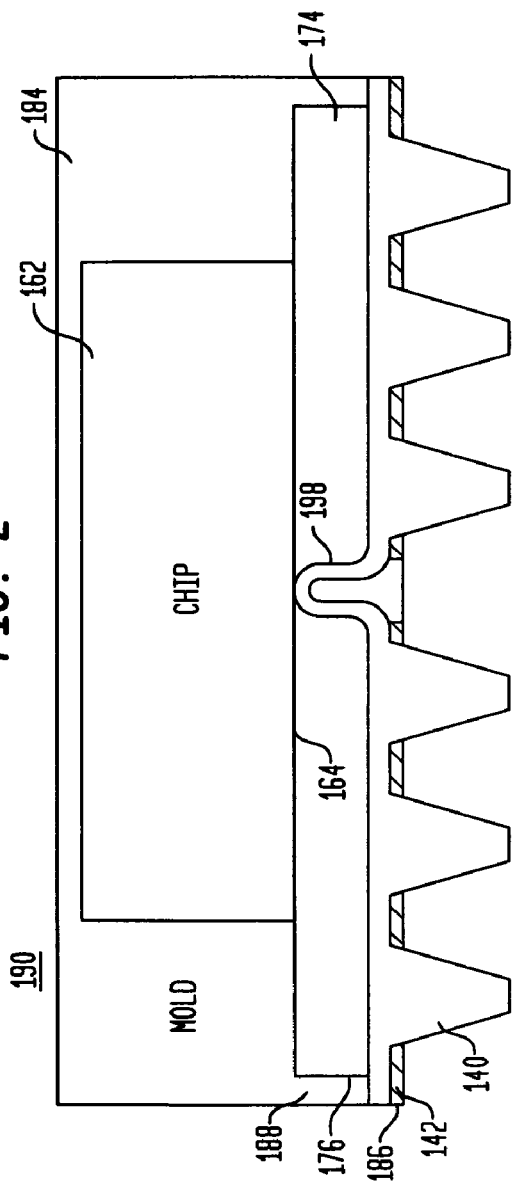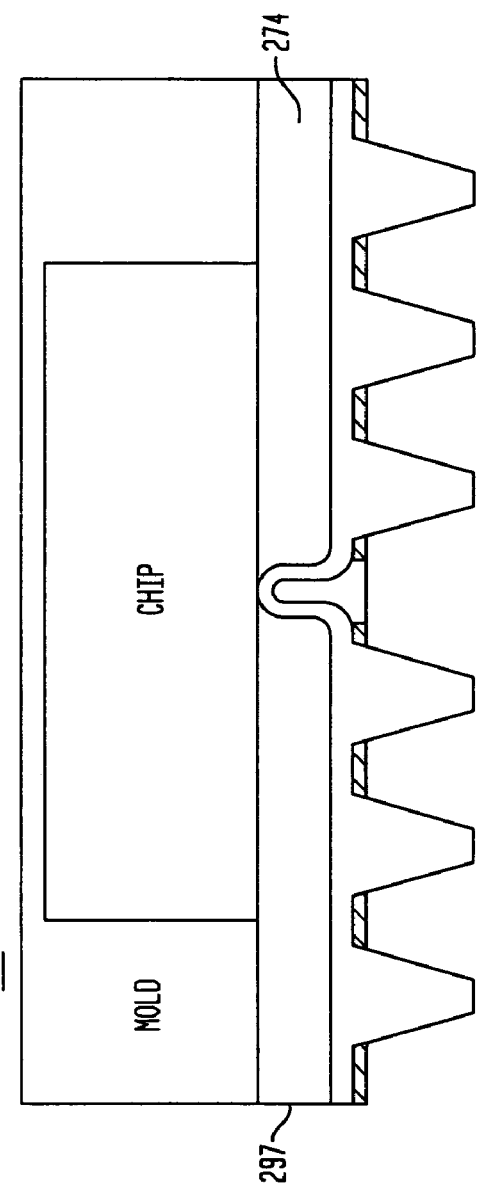

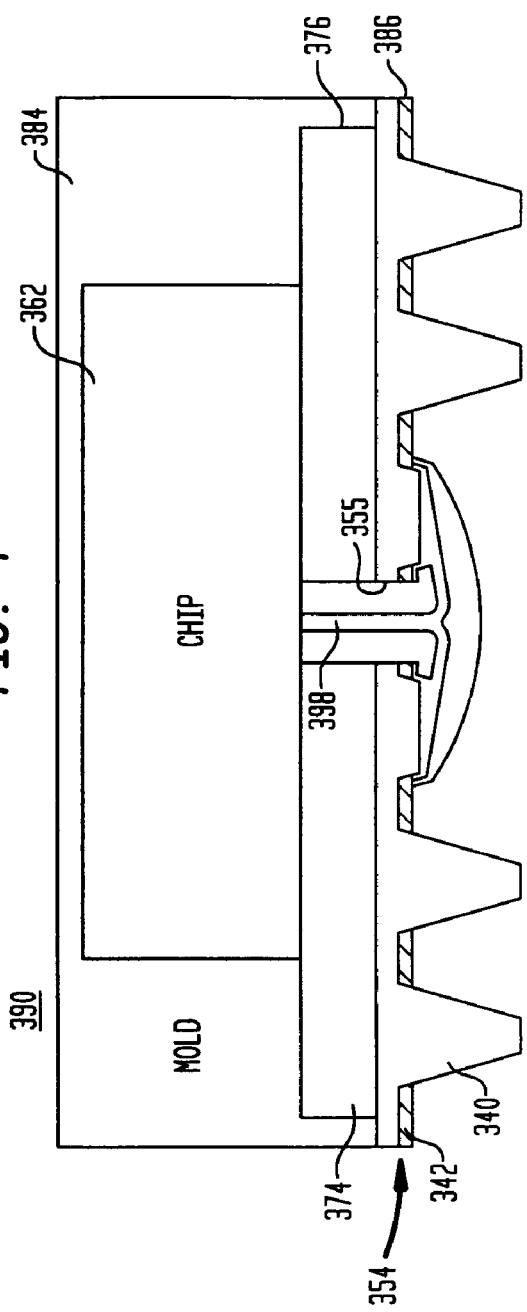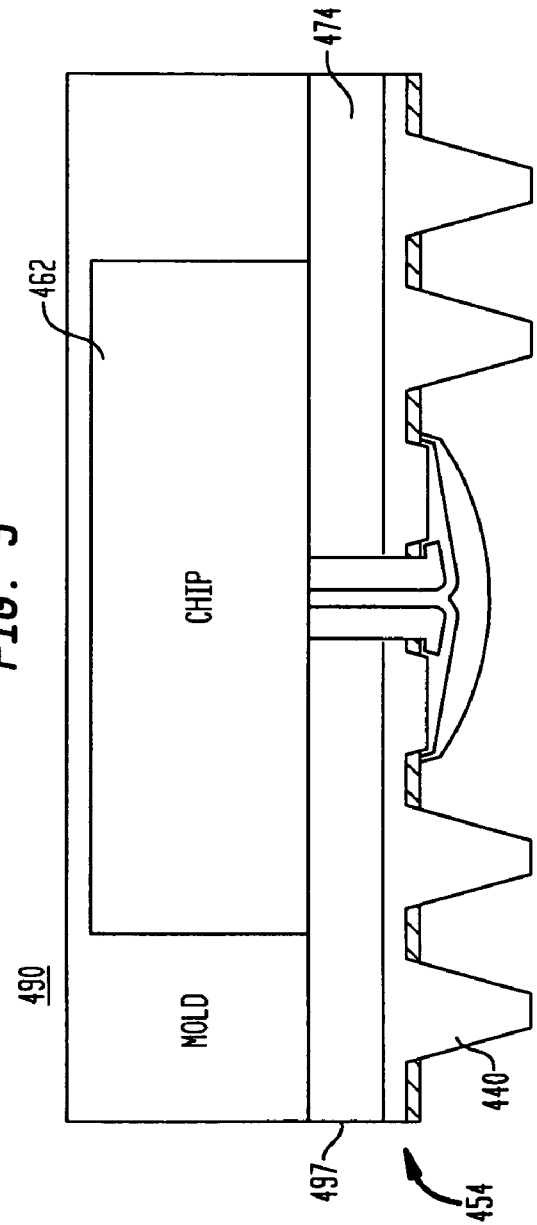

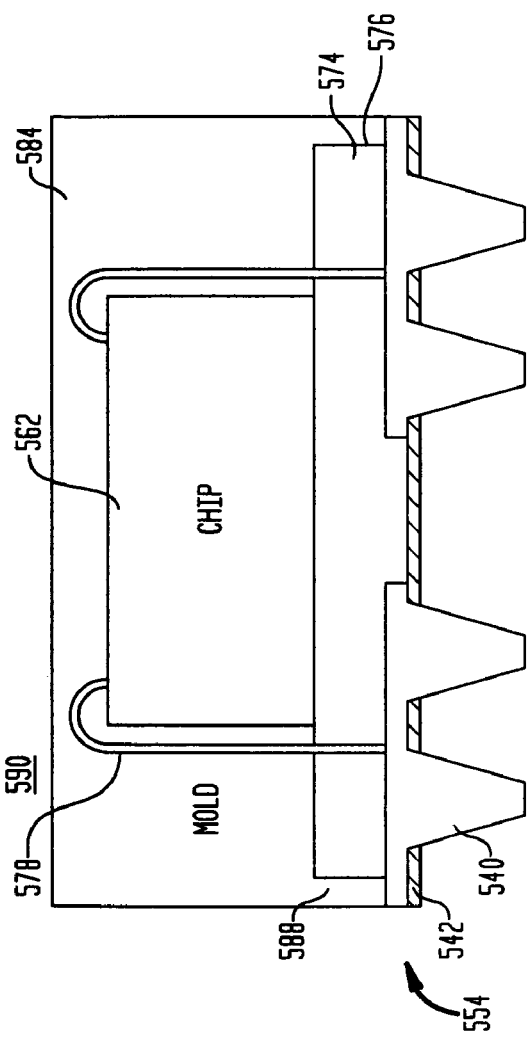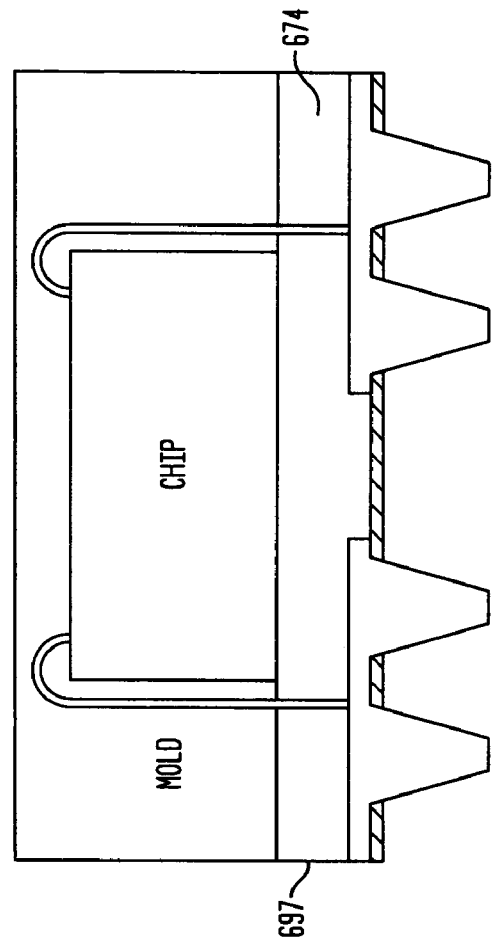

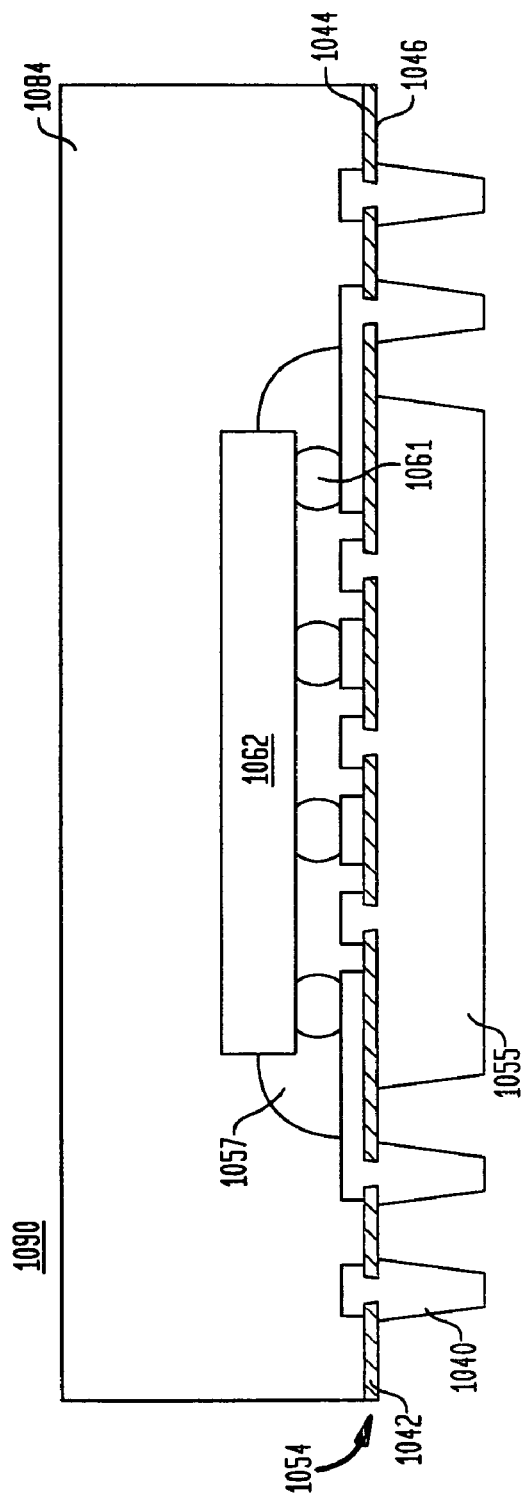
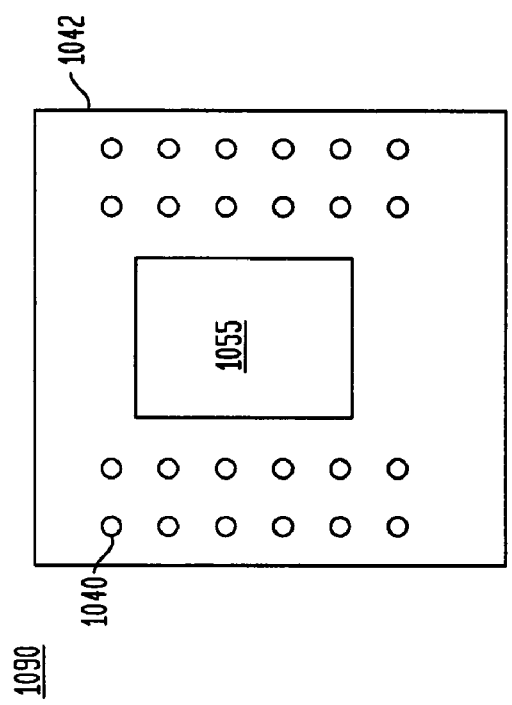
FIG. 12A
FIG. 12B

MICROELECTRONIC PACKAGES AND METHODS THEREFOR

CROSS REFERENCE TO RELATED APPLICATIONS

The present application claims benefit of U.S. Provisional Application Ser. Nos. 60/621,865, filed Oct. 25, 2004 and 60/583,066, filed Jun. 25, 2004, the disclosures of which are hereby incorporated by reference herein.

FIELD OF THE INVENTION

The present invention generally relates to microelectronic packages and more specifically to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages, which facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In the surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm to about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages" occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, these effects tend to cause the terminals to move relative to the contact pads on the circuit board. This can impose stresses in the solder, which connects the terminals to the substrates. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals which are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar pads. If the terminals of the package are not coplanar, or if the conductive elements of the test fixture are not coplanar, some of the terminals will not contact their respective contact pads on the test fixture. For example, in a BGA package, differences in diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, where the packaged device has solder balls on its terminals, solder tends to accumulate on those parts of the test fixture, which engage the solder balls. This can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308 both issued to Nishiguchi et al. disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals which can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

There have been a number of advances related to providing microelectronic packages having pins or conductive posts that are movable relative to a microelectronic element. Certain preferred embodiments of commonly assigned U.S. patent application Ser. No. 10/959,465, filed Oct. 6, 2004, disclose a microelectronic package including a microelectronic element having faces and contacts and a flexible substrate spaced from and overlying a first face of the microelectronic element. The package has a plurality of conductive posts extending from the flexible substrate and projecting away from the first face of the microelectronic element, with at least some of the conductive posts are electrically interconnected with the microelectronic element. The microelectronic package includes a plurality of support elements supporting the flexible substrate over the microelectronic element. The conductive posts are offset from the support elements to facilitate flexure of the substrate and movement of the posts relative to the microelectronic element.

Certain preferred embodiments of commonly assigned U.S. Provisional Application No. 60/533,393 entitled "Micro Pin Grid Array With Wiping Action," disclose a microelectronic package includes a mounting structure, a microelectronic element associated with the mounting structure, and a plurality of conductive posts physically connected to the mounting structure and electrically connected to the microelectronic element. The conductive posts project from the mounting structure in an upward direction, with at least one of the conductive posts being an offset post. Each offset post has a base connected to the mounting structure, and the base of each offset post defines a centroid. Each offset post also defines an upper extremity having a centroid, the centroid of the upper extremity being offset from the centroid of the base in a horizontal offset direction transverse to the upward direction. The mounting structure is adapted to permit tilting of each offset post about a horizontal axis so that the upper extremities may wipe across a contact pad of an opposing circuit board.

Certain preferred embodiments of commonly assigned U.S. Provisional Application No. 60/533,437 entitled "Micro Pin Grid Array With Pin Motion Isolation," disclose a microelectronic package including a microelectronic element having faces and contacts, a flexible substrate overlying and spaced from a first face of the microelectronic element, and a plurality of conductive terminals exposed at a surface of the flexible substrate. The conductive terminals are electrically interconnected with the microelectronic element and the flexible substrate includes a gap extending at least partially around at least one of the conductive terminals. In certain embodiments, the package includes a support layer, such as a compliant layer, disposed between the first face of the microelectronic element and the flexible substrate. In other embodiments, the support layer includes at least one opening that is at least partially aligned with one of the conductive terminals.

Despite all of the above-described advances in the art, there remains a need for microelectronic packages having terminals that can accommodate test boards having non-planar contact pads. There also remains a need for microelectronic packages that are able to form reliable electrical interconnections with a circuit board during testing and burn-in of the package. Thus, still further improvements in making and testing microelectronic packages would be desirable.

SUMMARY OF THE INVENTION

In certain preferred embodiments of the present invention, a microelectronic package includes a microelectronic element, such as a semiconductor chip, having faces and contacts, the microelectronic element having an outer perimeter. The package may include a flexible substrate, such as a dielectric substrate made of a polymeric material, overlying and spaced from a first face of the microelectronic element, whereby an outer region of said flexible substrate extends beyond the outer perimeter of the microelectronic element. The package desirably has a plurality of conductive posts exposed at a surface of the flexible substrate that are electrically interconnected with the microelectronic element, with at least one of the conductive posts being disposed in the outer region of the flexible substrate. A compliant layer is preferably disposed between the first face of the microelectronic element and the flexible substrate, the compliant layer overlying the at least one of the conductive posts that is disposed in the outer region of the flexible substrate. The package also desirably includes a support element in contact with the microelectronic element and the compliant layer, whereby the support element overlies the outer region of the flexible substrate.

In certain preferred embodiments, the conductive posts are movable independently of one another, and are movable relative to the microelectronic element. The independent movement of the conductive posts enables the posts to conform to a non-planar surface of a second microelectronic element so as to form a reliable electrical interconnection between the package and the second microelectronic element.

In certain preferred embodiments, the first face of the microelectronic element is a front face of the microelectronic element and the contacts are accessible at the front face. In other preferred embodiments, the microelectronic element has a second face facing away from the flexible substrate, whereby the contacts are accessible at the second face. The microelectronic element may be operable to interchange signals at a frequency above about 300 MHz through at least some of the conductive posts.

The flexible substrate may include conductive traces provided thereon, with the conductive traces electrically interconnecting at least some of the conductive posts with the microelectronic element. The flexible substrate desirably has a first surface facing the microelectronic element, with the conductive traces extending along the first surface of the flexible substrate. In other preferred embodiments, the flexible substrate may have a second surface facing away from the microelectronic element, with the conductive traces extending along the second surface of the flexible substrate.

In certain preferred embodiments, the contacts on the microelectronic element may be spaced in a grid array over one of the faces of the microelectronic element. In other embodiments, the contacts may be disposed in one or more rows extending over one of the faces of the microelectronic element.

The support for the package desirably includes a rigid protective layer covering the microelectronic element and a first surface of the compliant layer facing away from the conductive posts. The rigid protective layer is desirably made of a material selected from the group consisting of epoxies, glass and polymers. The flexible substrate preferably extends beyond the outer edge of the compliant layer to define a gap. The rigid protective layer preferably fills the gap.

In other preferred embodiments of the present invention, a microelectronic assembly includes the above-described package and a circuit panel having contact pads, the conductive posts having tips remote from the flexible substrate. The tips of the conductive posts confront the contact pads and are electrically connected to the contact pads. The assembly may also include an electrically conductive bonding material securing the conductive posts to the contact pads.

In further preferred embodiments of the present invention, a microelectronic package includes a microelectronic element having faces and contacts, a flexible substrate overlying and spaced from a first face of the microelectronic element, and a plurality of conductive posts exposed at a surface of the flexible substrate and being electrically interconnected with the microelectronic element, at least one of the conductive posts being located in an outer region of the flexible substrate that extends beyond the outer perimeter of the microelectronic element. The package also desirably includes a compliant layer disposed between the first face of the microelectronic element and the flexible substrate, whereby the compliant layer includes a section that overlies the at least one of the conductive posts located in the outer region of the flexible substrate, and a protective layer in contact with the microelectronic element and the section of the compliant layer that overlies the at least one of the conductive posts located in the outer region of the flexible substrate.

The flexible substrate desirably has a first surface facing the microelectronic element and a second surface facing away from the microelectronic element. The conductive traces may overly the first surface of the flexible substrate. In other embodiments, the conductive traces may overly the second surface of the flexible substrate.

In certain preferred embodiments, the microelectronic element has a first face facing toward the flexible substrate and a second face facing away from the flexible substrate. The contacts may be accessible at the first face of the microelectronic element and/or the second face of the microelectronic element. The package may also include wire bonds for electrically interconnecting the microelectronic element and the conductive posts.

In still other preferred embodiments of the present invention, a microelectronic package includes a microelectronic element having faces and contacts, a substrate overlying and spaced from a first face of the microelectronic element, a plurality of conductive posts exposed at a surface of the substrate and being electrically interconnected with the microelectronic element, and at least one thermally conductive element extending through the substrate and being in thermal communication with the microelectronic element for removing heat from the package. The at least one thermally conductive element is preferably electrically isolated from the microelectronic element.

The package may include a thermally conductive material between the microelectronic element and the at least one thermally conductive element for transferring heat energy from the microelectronic element to the at least one thermally conductive element. The thermally conductive material desirably includes a dielectric material. The package may also include a protective encapsulant layer covering the microelectronic element and the substrate, the protective encapsulant layer desirably including a material selected from the group consisting of epoxies, polymers and glass.

The above-described microelectronic package having a heat spreader may be assembled with a circuit panel having electrically conductive contact pads and at least one thermally conductive pad. During assembly, the conductive posts, having tips remote from the flexible substrate, are placed in engagement with the contact pads and are electrically connected to the contact pads, with the at least one thermally conductive element being in thermal communication with the at least one thermally conductive pad. The assembly may include an electrically conductive bonding material securing the conductive posts to the contact pads.

In further preferred embodiments of the present invention, a microelectronic package includes a microelectronic element having faces and contacts, a dielectric substrate overlying and spaced from a first face of the microelectronic element, and a plurality of conductive posts extending from a bottom surface of the substrate and being electrically interconnected with the microelectronic element. The package desirably includes a rigid protective layer covering a top surface of the substrate and encapsulating the microelectronic element, whereby the rigid protective layer limits movement of the conductive posts relative to the microelectronic element. In certain preferred embodiments, the dielectric substrate includes a flexible dielectric sheet. The package may also include an adhesive for securing the microelectronic element to the substrate. The adhesive may be rigid.

In still other preferred embodiments of the present invention, a microelectronic assembly includes at least two stacked microelectronic packages. Each microelectronic package desirably includes a microelectronic element, a flexible substrate having a top surface and a bottom surface, the substrate overlying and being spaced from a face of the microelectronic element, and a plurality of conductive posts exposed at a bottom surface of the flexible substrate, the conductive posts being electrically interconnected with the microelectronic element. The at least two stacked microelectronic packages desirably include a first microelectronic package and a second microelectronic package stacked atop the first microelectronic package so that the conductive terminals of the second microelectronic package confront the top surface of the flexible substrate of the first microelectronic package. The assembly also desirably includes a rigid conductive material connecting ends of the conductive terminals of the second microelectronic package with the flexible substrate of the first microelectronic package, whereby the rigid material prevents movement of the ends of the conductive terminals of the second microelectronic package.

In other preferred embodiments of the present invention, a microelectronic assembly includes a dielectric substrate having a top or first surface and a bottom or second surface remote therefrom. The microelectronic assembly desirably includes conductive traces formed atop the second surface. In other preferred embodiments, the conductive traces may be formed over the first surface, or over both the first surface and the second surface. The microelectronic assembly preferably includes conductive pins or posts that are electrically interconnected with the conductive traces and project from one of the surfaces of the dielectric substrate. The conductive posts are preferably covered with a highly conductive material such as gold. In certain preferred embodiments, the conductive posts have a diameter of approximately 50-200 microns and a length of approximately 50-200 microns. In more preferred embodiments, the tips of the conductive posts have a diameter of about 100 microns. The center-to-center pitch of the conductive pins is preferably about 100-300 microns, more preferably about 225-275 microns and even more preferably about 250 microns.

The microelectronic assembly also preferably includes a microelectronic element, such as a semiconductor chip, having a first contact bearing face and a second face remote therefrom. The microelectronic element preferably has a height of about 50-200 microns and more preferably a height that is less than 200 microns. The microelectronic element is assembled with the dielectric substrate using an underfill layer, which may be made of an adhesive or encapsulant material. After the microelectronic element has been assembled with the dielectric substrate, the tip ends of the conductive posts preferably project beyond the microelectronic element.

The microelectronic assembly preferably has a height that extends from the first surface of the dielectric substrate to the tips of the conductive posts. In certain preferred embodiments, the height of the microelectronic assembly is about 75-300 microns and more preferably between about 100-200 microns.

A microelectronic stack may be assembled by utilizing two or more of the above-described microelectronic assemblies. In certain preferred stacking methodologies, the conductive posts of a first microelectronic assembly are electrically interconnected with conductive pads on another circuitized element such as a printed circuit board. One preferred method for forming the electrical interconnection utilizes a conductive material such as solder. After the first microelectronic assembly is connected with an external element such as a printed circuit board, conductive material is preferably positioned atop the conductive pads provided on the dielectric substrate of the first microelectronic assembly. A second microelectronic assembly is preferably assembled over the first microelectronic assembly so that the conductive posts of the second microelectronic assembly are in electrical contact with the conductive pads of the first microelectronic assembly. Once again, the conductive posts of the second microelectronic assembly are secured to the conductive pads of the first microelectronic assembly using conductive material such as solder. The process is repeated by stacking a third microelectronic assembly atop the second microelectronic assembly and so forth. In certain preferred embodiments, the stacked assembly may be formed before the conductive posts of the first microelectronic assembly are electrically interconnected with the printed circuit board.

In still other preferred embodiments, an overmold may be provided over one or more layers of the stack, either before or after assembly of the microelectronic assemblies with the printed circuit board. In one preferred embodiment, the microelectronic assemblies are overmolded individually before they are assembled together in a stack. In other preferred embodiments, the microelectronic assemblies are arranged in a stack, overmolded, and then connected with another circuit element such as a printed circuit board. In still other preferred embodiments, the microelectronic elements are assembled in a stack atop the printed circuit board and then the entire stack is overmolded.

In other preferred embodiments, the conductive posts of the microelectronic assemblies may project from the faces of the respective dielectric substrates. In still other preferred embodiments, the conductive posts may be replaced by conductive balls that project from either the top or the bottom surfaces of the dielectric substrate.

In other preferred embodiments of the present invention, a microelectronic assembly may be programmed by breaking the conductive traces extending over the dielectric substrate of the assembly. The microelectronic assembly desirably includes conductive traces extending over one or more surfaces of a dielectric substrate. The conductive traces have first ends that are electrically interconnected with contacts on a microelectronic element and second ends that terminate at conductive pads. The microelectronic assembly also preferably includes conductive posts that are electrically interconnected with the conductive pads and that project from the second surface of dielectric substrate.

The microelectronic assembly desirably includes a main trace that is electrically interconnected with a microelectronic element. The main trace is preferably electrically interconnected with a plurality of branch traces that are in turn electrically connected with conductive pads, respectively. Each of the branch traces includes a cuttable section that may be cut for electrically isolating one or more of the conductive pads from the main trace. As a result, all but one of the conductive pads are electrically isolated from the main trace and the microelectronic element. A plurality of such assemblies may be stacked atop one another.

In other preferred embodiments, instead of cutting the branch traces to program the microelectronic assembly, one of the branch traces can be connected with the main trace, while the remaining branch traces remain electrically isolated from the main trace. Thus, the assembly is programmed by forming an electrical interconnection between one of the branch traces and the main trace.

These and other preferred embodiments of the present invention will be described in more detail below.

BRIEF DESCRIPTION OF THE DRAWINGS

FIG. 2 shows a microelectronic package, in accordance with another preferred embodiment of the present invention.

FIG. 3 shows a microelectronic package, in accordance with other preferred embodiments of the present invention.

FIG. 4 shows a microelectronic package, in accordance with further preferred embodiments of the present invention.

FIG. 5 shows a microelectronic package, in accordance with still further preferred embodiments of the present invention.

FIG. 6 shows a microelectronic package, in accordance with yet further preferred embodiments of the present invention.

FIG. 7 shows a microelectronic package, in accordance with another preferred embodiment of the present invention.

FIG. 12A shows a cross-sectional view of a microelectronic package, in accordance with still another preferred embodiment of the present invention.

FIG. 12B shows a bottom plan view of the microelectronic package shown in FIG. 12A.

DETAILED DESCRIPTION

Figure 1A:
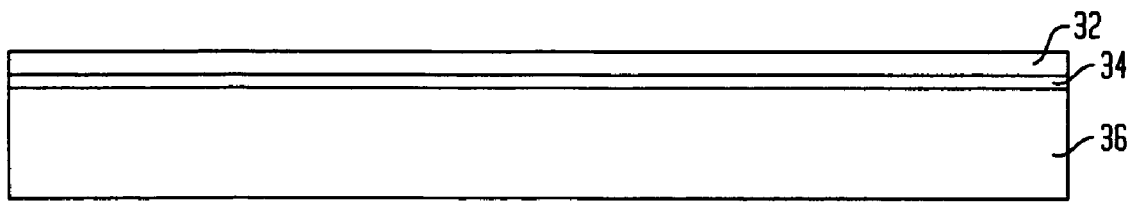
FIGS. 1A-1K show a method of making a microelectronic package, in accordance with certain preferred embodiments of the present invention.
Figure 1B:
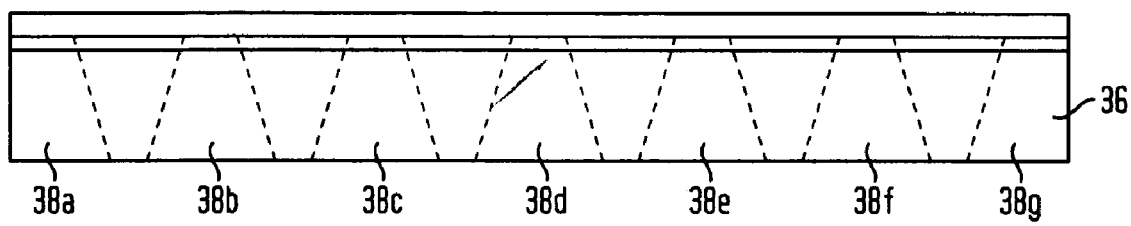
Figure 1C:
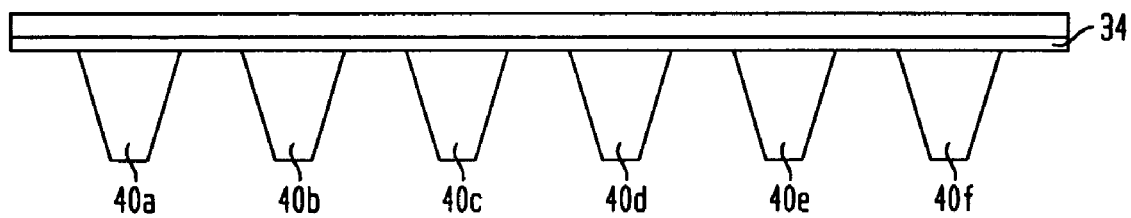
Figure 1D:
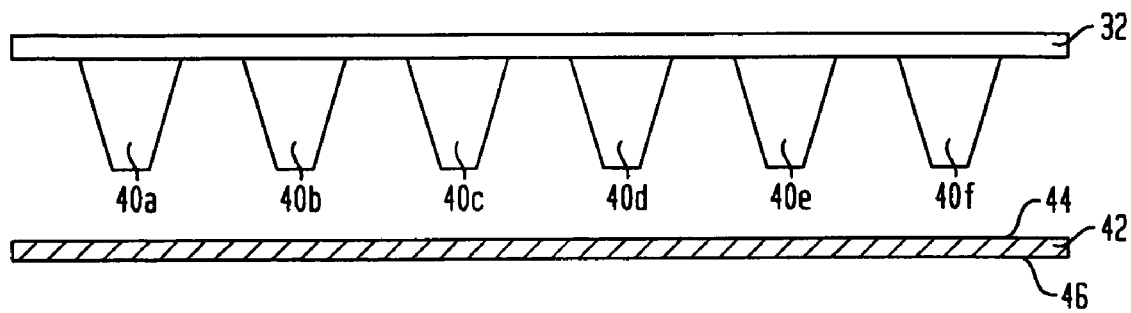

Referring to FIG. 1A, in certain preferred embodiments of the present invention, a microelectronic subassembly may be fabricated by a process such as that disclosed in certain preferred embodiments of co-pending, commonly assigned U.S. Provisional Application No. 60/508,970, the disclosure of which is incorporated by reference herein. As disclosed in certain preferred embodiments of the '970 application, a metallic plate 30 includes a top layer 32 made of a conductive material, an intermediate etch stop layer 34 and a bottom layer 36 made of a conductive material. The top and bottom layers 32, 36 may include electrically conductive materials such as copper. The intermediate etch stop layer 34 may include materials such as nickel. Referring to FIGS. 1B and 1C, the bottom layer 36 of metallic plate 30 is stamped or etched to remove portions 38a-38g of bottom layer 36 so as to form conductive terminals or posts 40a-40f. Referring to FIGS. 1C and 1D, after the posts 40a-40f have been formed, the etch stop layer 34 (FIG. 1C) is removed by a process that leaves the top layer 32 and the posts 40a-40f in place. One preferred method for removing the etch stop layer includes a chemical etching process.

The dimensions of the conductive posts can vary over a significant range, but most typically the height of each post above the surface of the dielectric substrate is about 50-300 µm. Each post has a base adjacent the dielectric substrate and a tip remote from the dielectric substrate. In certain preferred embodiments, the posts are generally frustoconical, so that the base and tip of each post are substantially circular. The bases of the posts typically are about 100-600 µm in diameter, whereas the tips typically are about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

Figure 1E:
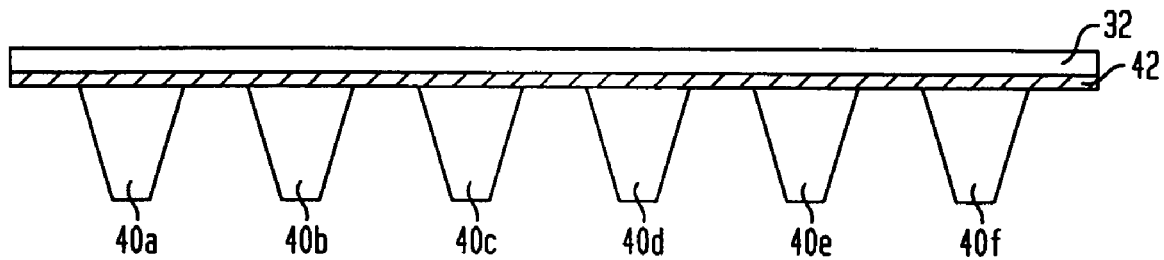
Figure 1F:
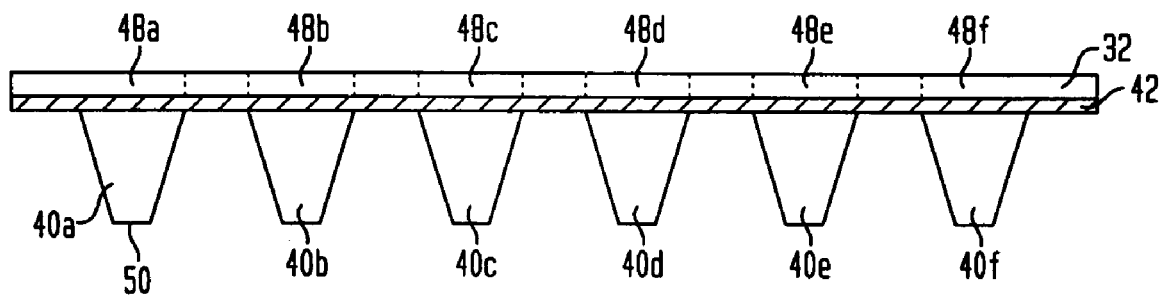

Referring to FIGS. 1D and 1E, a flexible dielectric sheet 42 such as a polyimide film is assembled with the top layer 32 and the posts 40a-40f so that the posts 40a-40f project through the dielectric layer 42. As shown in FIG. 1D, a first face 44 of the dielectric layer 42 faces toward the top layer 32 and a second face 46 faces away from the top layer 32. The dielectric layer 42 may be fabricated by coating a dielectric layer such as a polyimide onto the top layer 32 and around the terminals 40a-40f. In other preferred embodiments, the dielectric layer 42 may be assembled with the top layer 32 and the conductive posts 40a-40f by forcibly engaging the terminals with the dielectric sheet so that the terminals penetrate through the sheet. Although the thickness of the dielectric layer 42 may vary according to the application, the dielectric layer is preferably about 15-100 µm thick. Referring to FIG. 1F, once the dielectric layer 42 is in place, the top layer 32 is etched to form individual conductive traces 48a-48f on the first face 44 of the dielectric layer 42.

In certain preferred embodiments, the conductive traces are disposed on a bottom surface of the dielectric layer. However, in other embodiments, the conductive traces may extend on the top surface of the dielectric layer; on both the top and bottom faces or within the interior of the dielectric layer. Thus, as used in this disclosure, a statement that a first feature is disposed "on" a second feature should not be understood as requiring that the first feature lie on a surface of the second feature. The conductive traces may be formed from any electrically conductive material, but most typically are formed from copper, copper alloys, gold or combinations of these materials. The thickness of the traces will also vary with the application, but typically is about 5 µm-25 µm.

In the particular embodiment illustrated in FIGS. 1A-1F, the flexible dielectric layer 42 is assembled with top layer 32 before the top layer is treated. However, in other embodiments, the flexible dielectric layer 42 may be attached to the top layer 32 after the conductive traces 48a-48f (FIG. 1F) have been formed, or at a later process step. In other preferred embodiments, conventional processes such as plating may form the traces. An etching process may also be used, whereby the conductive posts 40a-40f may be formed using the methods disclosed in commonly assigned U.S. Pat. No. 6,177,636, the disclosure of which is hereby incorporated by reference herein. In yet other preferred embodiments, the conductive posts 40a-40f may be fabricated as individual elements and assembled to the flexible dielectric layer in any suitable manner that connects the conductive posts 40a-40f to the conductive traces 48a-48f. As used herein, the terminology "conductive terminal" may also mean a conductive bump, or a conductive post having a height significantly greater than its width.

Figure 1G:
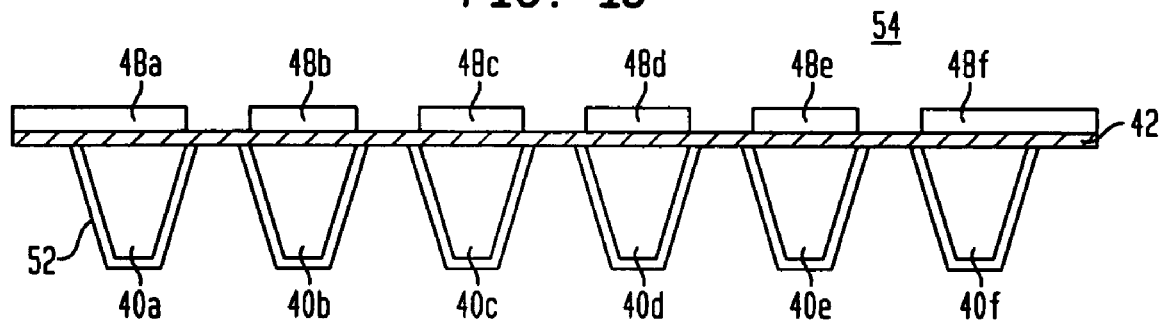

Referring to FIGS. 1F and 1G, each conductive terminal 40a-40f has an exposed contact surface 50. Referring to FIG. 1G, a highly conductive metal layer 52 such as gold may be formed over an outer surface of the conductive posts 40a-40f. The assembly shown in FIG. 1G is hereinafter referred to as connection component 54.

Figure 1H:
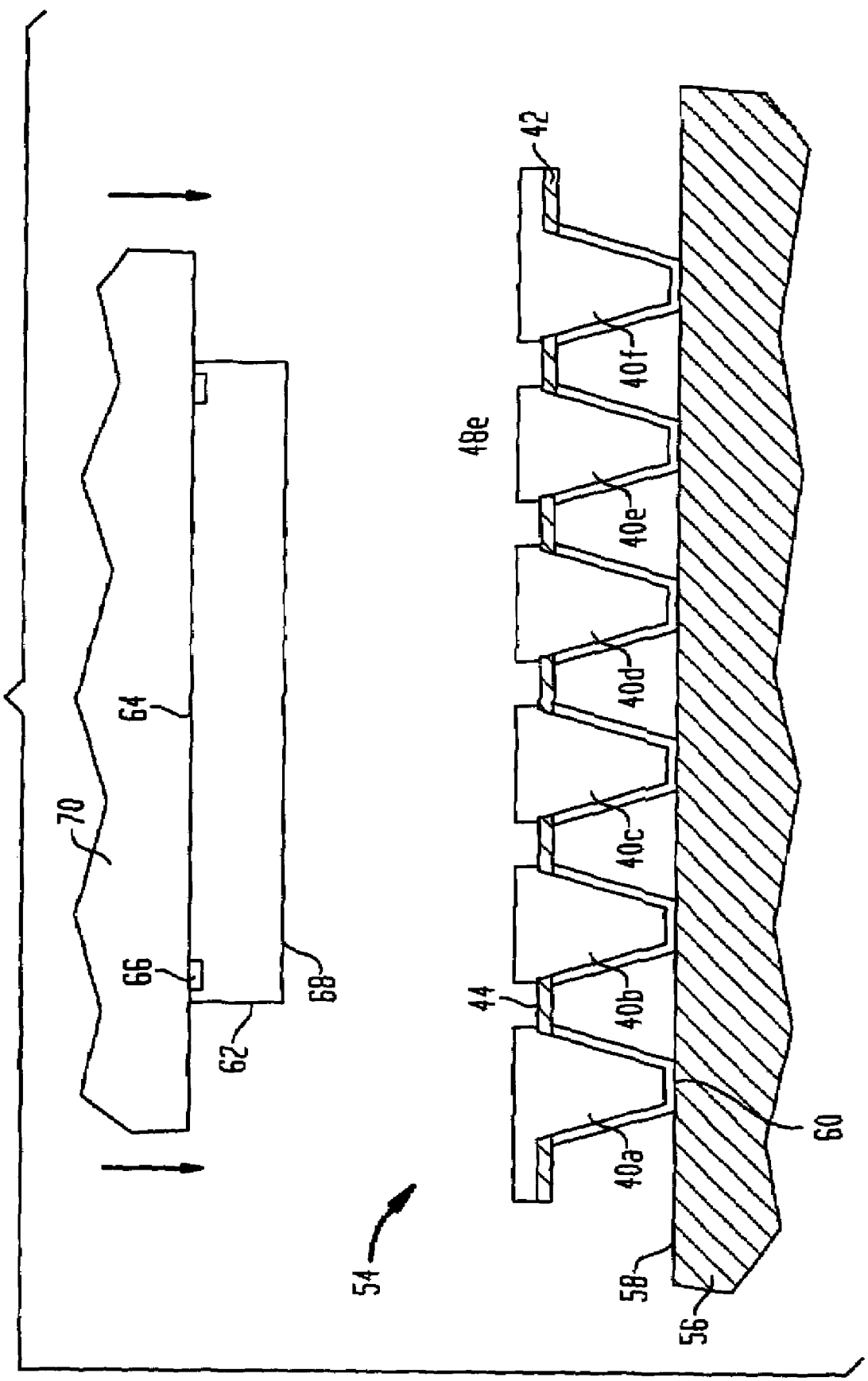

Referring to FIG. 1H, connection component 54 is positioned over a support element 56 having a top surface 58. The top surface 58 of support element 56 is preferably substantially flat or planar so that the bottom 60 of conductive posts 40a-40f lie in a common plane. A microelectronic element 62, such as a semiconductor chip, includes a front face 64 having contacts 66 and a back face 68 remote from front face 64. The front face 64 is held by vacuum chuck 70 and moved toward the first surface 44 of flexible dielectric layer 42.

Figure 1I:
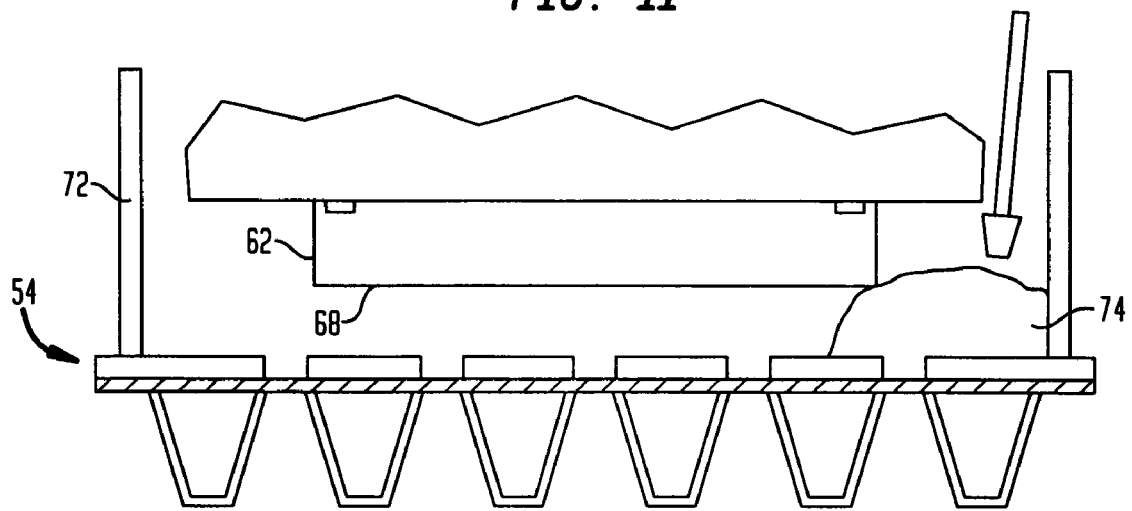

Referring to FIG. 1I, a frame 72 is abutted against the top surface of the microelectronic subassembly 54. A curable dielectric material, such as a curable elastomer 74 is introduced between the rear face 68 of semiconductor chip 62 and the microelectronic assembly 54. The frame 72 directs flow of the curable elastomer material 74.

Figure 1J:
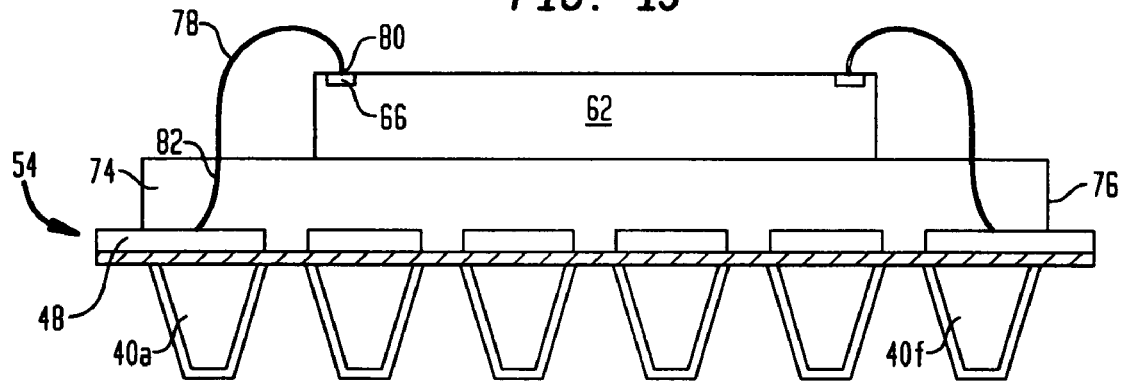

Referring to FIG. 1J, the curable elastomer material 74 is cured to provide a compliant layer 74 that extends between the semiconductor chip 62 and the microelectronic subassembly 54. The compliant layer may be made of a compliant material such as a gel, foam or the like. In certain preferred embodiments, the compliant layer may comprise a porous compliant layer formed from a plurality of pads defining channels between the pads. A curable elastomer may be injected in the channels between the compliant pads, as disclosed in commonly assigned U.S. Pat. No. 5,659,952, the disclosure of which is hereby incorporated by reference herein. In preferred embodiments, the compliant layer 74 has an outer perimeter 76 that overlies the outermost conductive posts 40a and 40f. The semiconductor chip 62 is electrically interconnected with one or more conductive posts 40a-40f by using wire bonds 78 having first ends 80 connected to a chip contact 66 and second ends 82 connected to one of the conductive traces 48. In certain preferred embodiments, the wire bonds 78 are formed before the curable elastomer material 74 (FIG. 1I) is introduced between the semiconductor chip 62 and the microelectronic subassembly 54. In another preferred embodiment of the present invention, the compliant layer 74 is pre-formed before it is disposed between the semiconductor chip and the microelectronic subassembly. The preformed compliant layer may have one or more openings extending therethrough for enabling wire bonds or conductive leads to pass therethrough, whereby the semiconductor chip 62 and the microelectronic subassembly may be electrically interconnected.

Figure 1K:
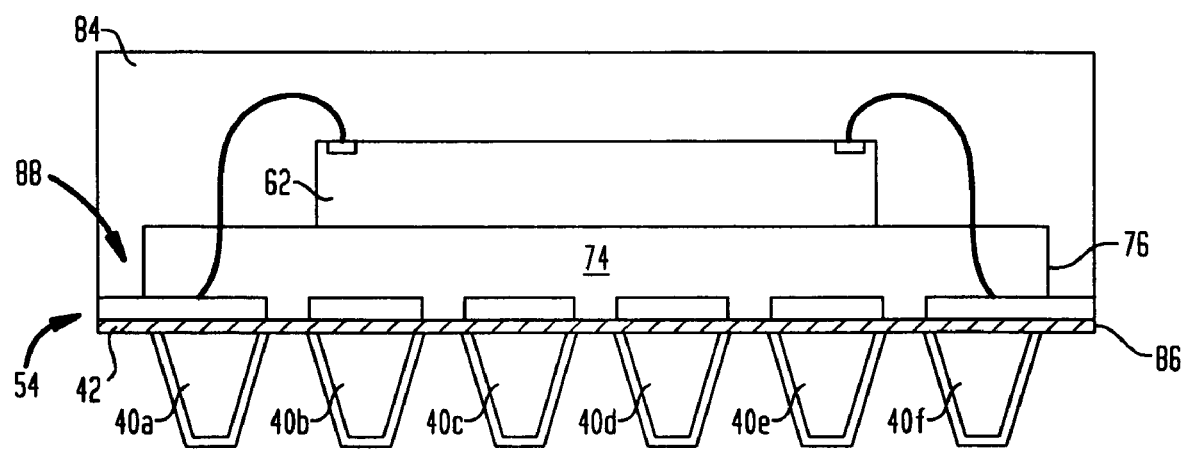

Referring to FIG. 1K, a protective layer 84, such as a curable epoxy, is provided over the semiconductor chip 62, the compliant layer 74 and the microelectronic subassembly 54. The protective layer 84 may be made of a wide variety of dielectric materials such as epoxies, polymers and glass. The protective layer 84 is preferably rigid when cured. In the particular preferred embodiment shown in FIG. 1K, the compliant layer 74 has the outer perimeter 76 that overlies all of the conductive posts 40a-40f. However, the outer perimeter 76 of compliant layer 74 does not extend all the way to the outer perimeter 86 of dielectric layer 42. As a result, the protective layer 84 fills a gap 88 between the outer perimeter 76 of compliant layer 74 and the outer perimeter 86 of flexible dielectric layer 42.

As shown in FIG. 1K, the conductive posts 40a-40f extend beyond an area covered by semiconductor chip 62. The wider area covered by the conductive posts enables more input and output connections for the microelectronic package. This provides a number of benefits. First, a larger number of connections may be made with the semiconductor chip 62. In addition, more space can be placed between the conductive posts 40a-40f, which will minimize interference as electrical signals are sent into and out of the package. Providing the compliant layer 74 over all of the conductive posts 40a-40f, enables the conductive terminals to move independently of one another. The compliant layer 74 also enables the conductive posts to move relative to the semiconductor chip 62. The protective layer 84 provides a rigid backing that prevents the outer regions of the flexible dielectric layer 42 from excessive bending or collapsing under pressure. For example, this may occur during a testing operation when the conductive posts are pressed against opposing contact pads. Thus, the protective layer 84 provides a support for the outer periphery of the flexible dielectric layer 42, while the conductive posts are able to move due to the compliant layer 74.

Figure 1L:
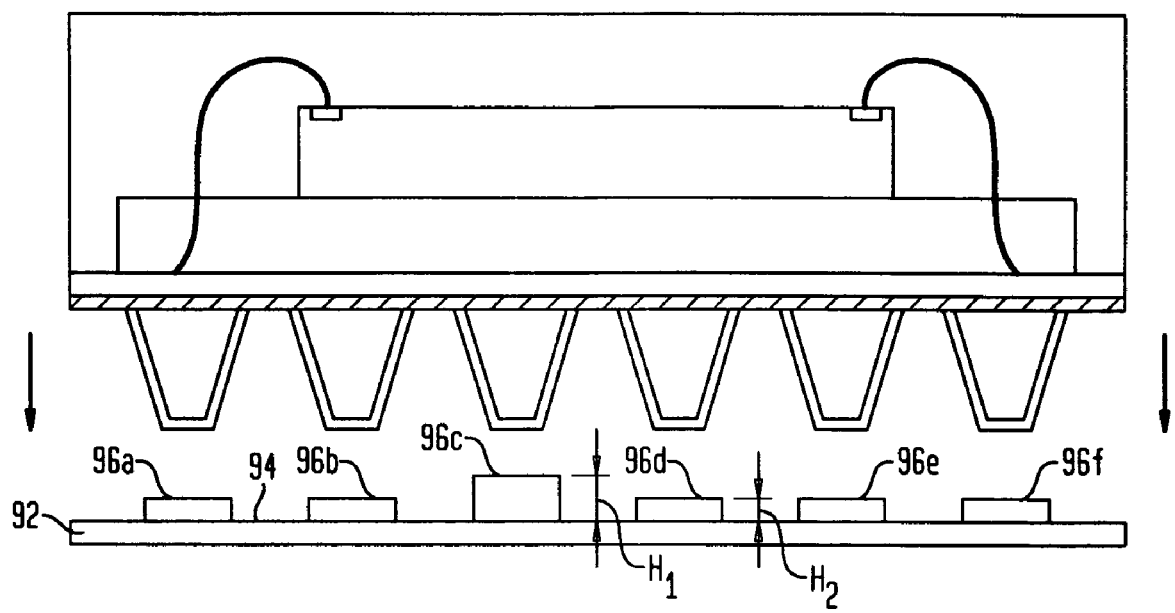
FIGS. 1L and 1M show a method of testing the microelectronic package shown in FIG. 1K, in accordance with certain preferred embodiments of the present invention.

FIG. 1L shows the microelectronic package 90 being juxtaposed with a second microelectronic element 92, such as a printed circuit board or test board. The second microelectronic element 92 includes a top surface 94 having conductive pads 96a-96f formed thereon. One of the conductive pads 96c has a height $H_1$ that is substantially greater than the height $H_2$ of the adjacent conductive pads.

Figure 1M:
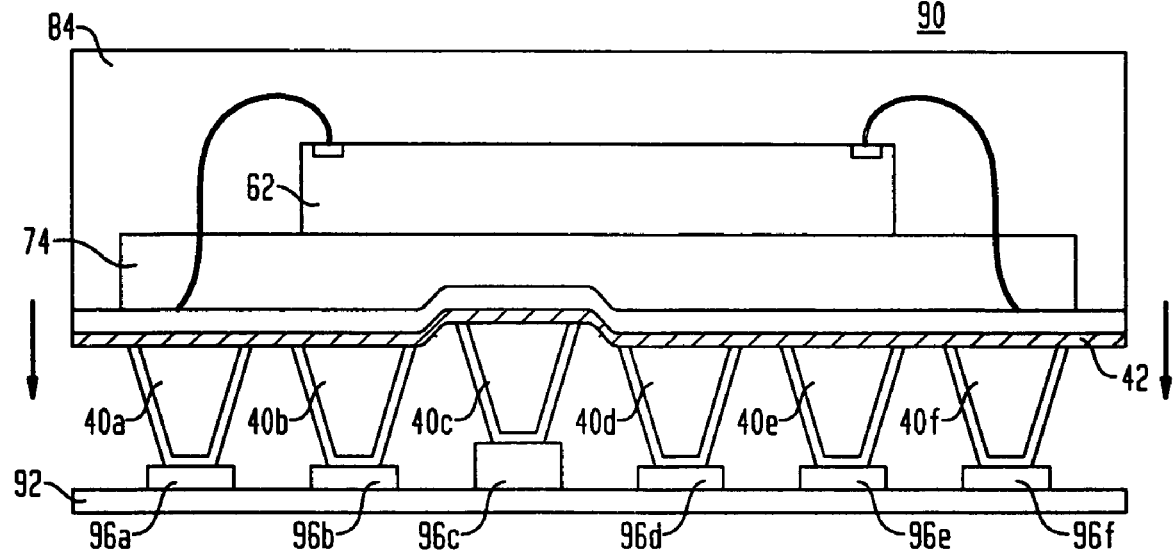

Referring to FIG. 1M, the conductive pads 40a-40f of microelectronic package 90 are abutted against the opposing conductive pads 96a-96f. As the microelectronic package 90 is brought toward the test board 92, the third conductive terminal 40c will be the first conductive terminal to contact one of the conductive pads 96. This is due to the fact that conductive pad 96 has a height $H_1$ that is greater than the height $H_2$ of the adjacent conductive pads. As the microelectronic package 90 continues to be moved downward, the compliant layer 74 above conductive terminal 40c compresses so as to enable conductive terminal 40c to more relative to semiconductor chip 62 and the other conductive posts 40a-b and 40d-f. As downward pressure is applied to the package, the protective layer 84 provides support to the edges of the package for preventing the peripheral regions of flexible dielectric layer 42 from bending.

The tips of the posts may not be precisely coplanar with one another, due to factors such as non-planarity of the front surface of the microelectronic device; warpage of the dielectric substrate; and unequal heights of the posts themselves. Also, the package may be tilted slightly with respect to the circuit board. For these and other reasons, the vertical distances between the tips of the posts and the contact pads may be unequal.

The independent displacement of the posts relative to one another allows all of the post tips to contact all of the contact pads on the test substrate. For example, the flexible substrate in the vicinity of conductive post 40c flexes substantially more than the flexible substrate in the vicinity of the conductive posts 40b and 40d.

Because all of the post tips can be engaged reliably with all of the contact pads, the package can be tested reliably by applying test signals, power and ground potentials through the test circuit board and through the engaged posts and contact pads. Moreover, this reliable engagement is achieved with a simple test circuit board. For example, the contact pads of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 µm of pin movement will suffice.

Although the embodiment shown in FIGS. 1A-1M is not limited by any particular theory of operation, it is believed that providing a microelectronic package having the fan-out arrangement shown herein will enable pressure to be applied to all of the conductive posts while maintaining the integrity of the microelectronic package. Furthermore, the compliant layer extending over all of the conductive posts enables the conductive posts to move independently of one another as well as move relative to the semiconductor chip 62.

Referring to FIG. 2, microelectronic package 190 includes flexible dielectric substrate 142 and a plurality of conductive posts 140 projecting through the dielectric layer 142. Package 190 includes conductive elements such as elongated traces or leads 198 for electrically interconnecting microelectronic element 162 with the conductive posts 140. Package 190 also includes compliant layer 174 disposed between a front face 164 of microelectronic element 162 and the flexible dielectric layer 142. The compliant layer 174 does not extend to the edge of package 190, however, the compliant layer 174 extends over all of the conductive posts 140. The combination of the conductive posts 140 being assembled to the flexible dielectric layer and the compliant layer 174 enables the conductive posts 140 to move independently of one another and relative to the microelectronic element 162. Package 190 also includes a protective mold layer 184 that covers the microelectronic element 162 and the compliant layer 174. The mold 184 fills in a gap 188 between the outer periphery 176 of compliant layer 174 and edge 186 of flexible dielectric layer 142. The mold 184 is preferably substantially rigid for providing support to the package, and especially the dielectric layer 142 of the package. Although the present invention is not limited by any particular theory of operation, it is believed mold 184 provides stabilizing support to the edges of the dielectric layer 142 including the conductive posts 140 located near the edges. In operation, the conductive posts 140 are free to move independently of one another and relative to the microelectronic element 162.

FIG. 3 shows a microelectronic package 290, in accordance with another preferred embodiment of the present invention. The microelectronic package 290 is generally similar to the package shown in FIG. 2. The compliant layer 274, however, extends to the edge 297 of the package 290.

FIG. 4 shows a microelectronic package 390, in accordance with still another preferred embodiment of the present invention. The microelectronic package 390 includes a flexible dielectric layer 342 and a plurality of conductive posts or pins 340 that extend through the dielectric layer 342. The dielectric layer 342 and the conductive posts 340 form a microelectronic subassembly 354. The microelectronic subassembly 354 includes a central opening 355 extending therethrough, which is preferably used for passing electrical interconnections between a microelectronic element 362 and the microelectronic subassembly 354. Microelectronic package 390 includes compliant layer 374 that is disposed between microelectronic element 362 and microelectronic subassembly 354. The compliant layer 374 includes an outer periphery 376 that extends over the conductive posts 340 at the outer edges of microelectronic subassembly 354. The microelectronic element 362 is electrically interconnected with the microelectronic subassembly 354 using conductive elements 398 such as leads or traces. The microelectronic package 390 also includes a protective layer 384 such as an epoxy overmold for encapsulating microelectronic element 362 and compliant layer 374. As noted above, the protective layer 384 protects the microelectronic element 362 and provides stabilizing support at the outer periphery 386 of microelectronic subassembly 354.

FIG. 5 shows a microelectronic package 490, in accordance with still another preferred embodiment of the present invention. The microelectronic package 490 is generally similar to that shown in FIG. 4. The microelectronic package 490 includes a compliant layer 474 provided between microelectronic element 462 and microelectronic subassembly 454. The compliant layer 474 enable conductive posts 440 to move independently of one another, as well as relative to microelectronic element 462. The compliant layer 474 extends to the edge 497 of microelectronic package 490.

FIG. 6 shows a microelectronic package 590, including a microelectronic subassembly 554 made of a flexible dielectric layer 542 and a plurality of conductive posts 540. The package 590 includes a microelectronic element 562 such as a semiconductor chip and a compliant layer 574 provided between microelectronic element 562 and microelectronic subassembly 554. Package 590 includes wire bonds 578 electrically interconnecting microelectronic element 562 with microelectronic subassembly 554. The wire bonds 578 may be formed either before or after compliant layer 574 is provided between microelectronic element 562 and microelectronic subassembly 554. Package 590 includes a protective layer 584 that encapsulates microelectronic element 562, wire bonds 578 and compliant layer 574. The protective layer 584 fills a gap 588 between outer edge 576 of compliant layer and the outer edge of microelectronic subassembly 554. As noted above, the protective layer 584 provides overall stabilizing support for the package so that the conductive posts 540 may be efficiently pressed against a second microelectronic element, such as a test board. The protective layer 584 also provides support to the outer periphery of the microelectronic subassembly 554.

FIG. 7 shows a microelectronic package 690 that is generally similar to that shown in FIG. 6. In the FIG. 7 embodiment, the compliant layer 674 extends to the edge 697 of the package 690.

Figure 8A:
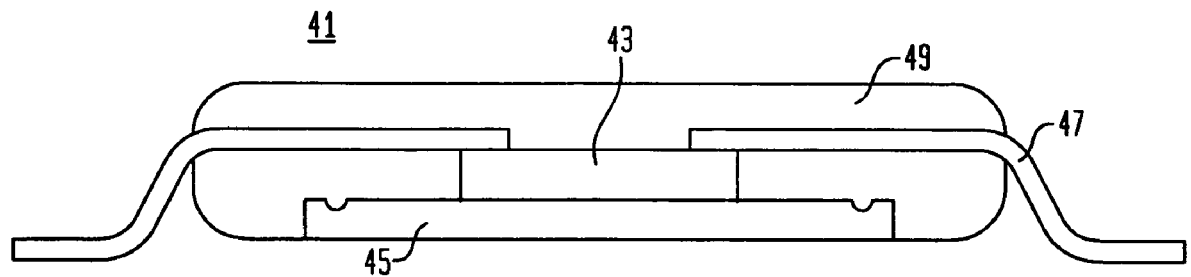
FIG. 8A shows a cross-sectional view of a prior art microelectronic package including a heat spreader.
Figure 8B:
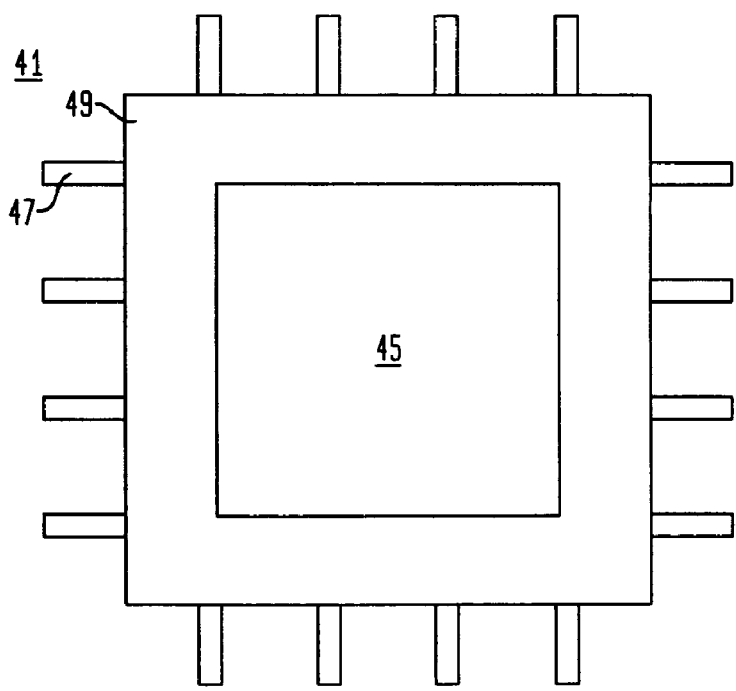
FIG. 8B shows a bottom plan view of the prior art microelectronic package shown in FIG. 8A.

FIGS. 8A and 8B shows a conventional RF microelectronic package 41. The conventional package 41 includes a semiconductor chip 43 in thermal communication with a heat spreader 45. The package 41 includes leads 47 that are electrically interconnected with chip 43. Package 41 includes an epoxy mold compound 49 that encapsulates the microelectronic chip 43. The heat spreader 45 is designed to remove heat from the package. When the package 41 is assembled with a printed circuit board, the heat spreader 45 is generally placed in thermal communication with a thermally conductive pad on the printed circuit board. The package 41 is substantially rigid so that the heat spreader is incapable of moving relative to the semiconductor chip 43. This may minimize the ability of the heat spreader 45 to effectively transfer heat from the package 41. Thus, there is a need for improved designs for removing heat from microelectronic packages.

Figure 9A:
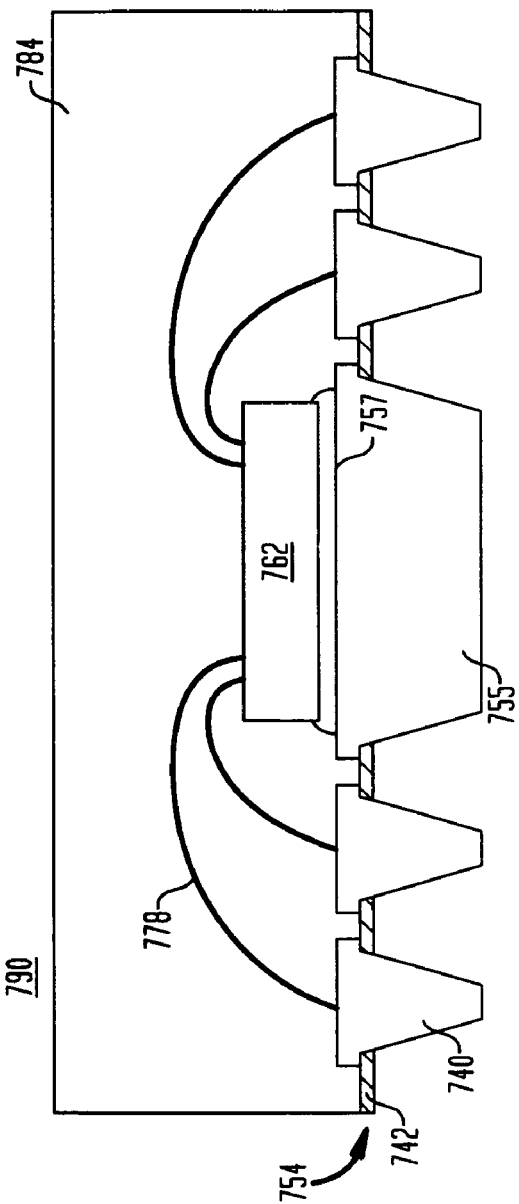
FIG. 9A shows a cross-sectional view of a microelectronic package having a flexible substrate and a heat spreader extending through the flexible substrate, in accordance with certain preferred embodiments of the present invention.
Figure 9B:
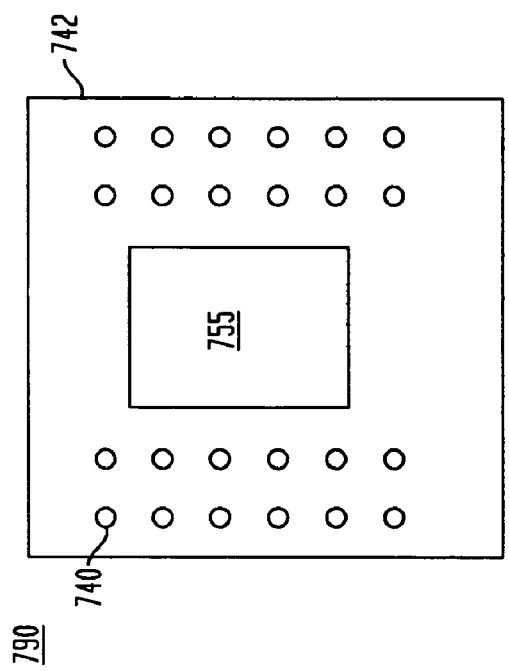
FIG. 9B shows a bottom plan view of the microelectronic package of FIG. 9A.

FIGS. 9A and 9B show a microelectronic package, in accordance with still another preferred embodiment of the present invention. The microelectronic package 790 includes a microelectronic subassembly 754 made of a flexible dielectric layer 742 and a plurality of conductive posts 740 that extend through dielectric layer 742. The microelectronic subassembly 754 also includes a heat spreader 755 extending through dielectric layer 742. The conductive posts 740 and the heat spreader 755 may be formed using the method shown and described above in FIGS. 1A-1K. Package 790 includes a microelectronic element 762, such as a semiconductor chip that is mounted over the microelectronic subassembly 754. Package 790 includes a thermally conductive material 757 used to attach microelectronic element 762 to heat spreader 755. The thermally conductive material 757 preferably conducts heat between microelectronic element 762 and heat spreader 755. However, thermally conductive material 757 is preferably not electrically conductive so that heat spreader 755 is electrically isolated from microelectronic element 762. The microelectronic element 762 is electrically interconnected with the conductive posts 740 using conductive elements 778, such as wire bonds. Package 790 includes a protective layer 784 that encapsulates microelectronic element 762 and conductive elements 778. The protective layer 784 may be made of dielectric materials such as epoxy, polymers or glass. The protective layer 784 may be made of a compliant material such as an elastomer. In embodiments where the protective layer 784 is compliant, the conductive posts 740 may be capable of moving independently of one another and relative to the microelectronic element 762. In operation, the package 790 is mounted atop a second microelectronic element such as a test board or printed circuit board. The conductive posts 740 are preferably placed in contact with opposing conductive pads on the second microelectronic element.

The heat spreader 755 is preferably placed in alignment with an opposing thermally conductive pad. The heat spreader 755 is preferably placed in contact with the thermally conductive pad for drawing heat from the package 790.

Figure 10A:
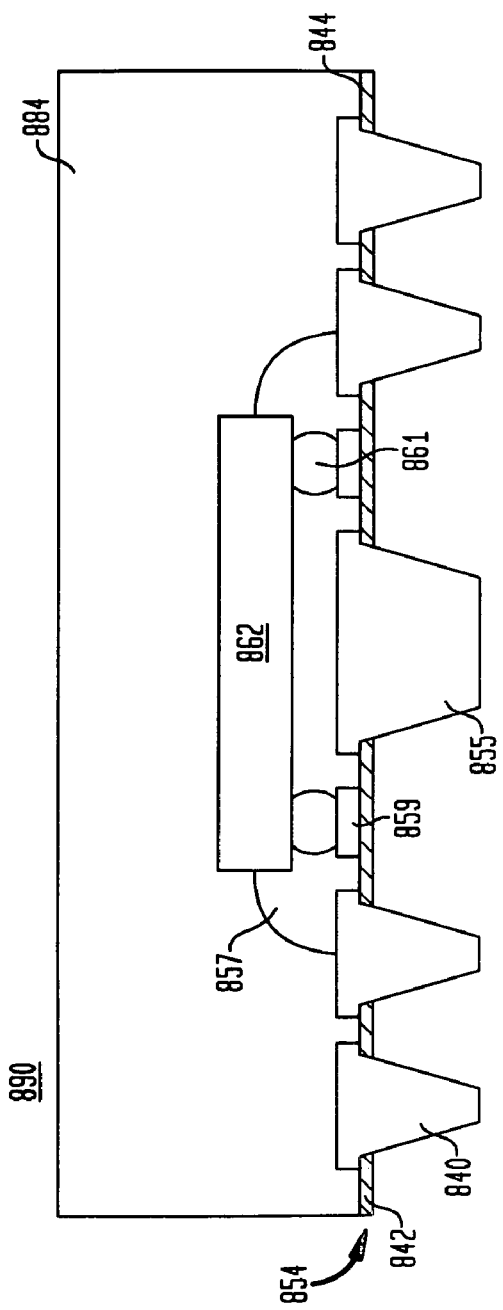
FIG. 10A shows cross-sectional view of a microelectronic package, in accordance with still further preferred embodiments of the present invention.
Figure 10B:
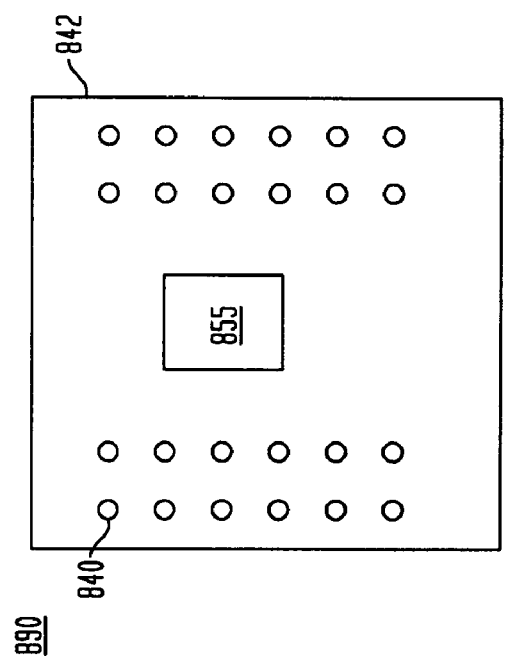
FIG. 10B shows a bottom plan view of the microelectronic package shown in FIG. 10A.

FIGS. 10A and 10B show a microelectronic package 890, in accordance with another preferred embodiment of the present invention. Microelectronic package 890 includes a microelectronic subassembly 854 made of a flexible dielectric layer 842 and a plurality of conductive posts 840. The microelectronic subassembly 854 also includes a heat spreader 855 extending through dielectric layer 842. The microelectronic subassembly 854 also includes contact pads 859 formed over a first surface 844 thereof. Microelectronic package 890 also includes a microelectronic element 862 interconnected with contact pads 859 by conductive masses 861 such as solder balls. Microelectronic package 890 includes a thermally conductive material 854 extending between microelectronic element 862 and microelectronic subassembly 854. The thermally conductive material 857 transfers heat between microelectronic element 862 and heat spreader 855 so as to remove heat from package 890. Microelectronic package 890 also includes a protective layer 884 that encapsulates microelectronic element 862 and covers first surface 844 of flexible dielectric layer 842. In certain preferred embodiments, protective layer 884 is made of rigid materials such as epoxy or glass. In other preferred embodiments, protective layer 884 may be made of compliant materials such as an elastomer. In still other preferred embodiments, the layer 842 may be substantially rigid. In operation, the package 890 is assembled with a second microelectronic element so that the heat spreader 855 is in contact with a thermally conductive pad for removing heat from the package.

Figure 11A:
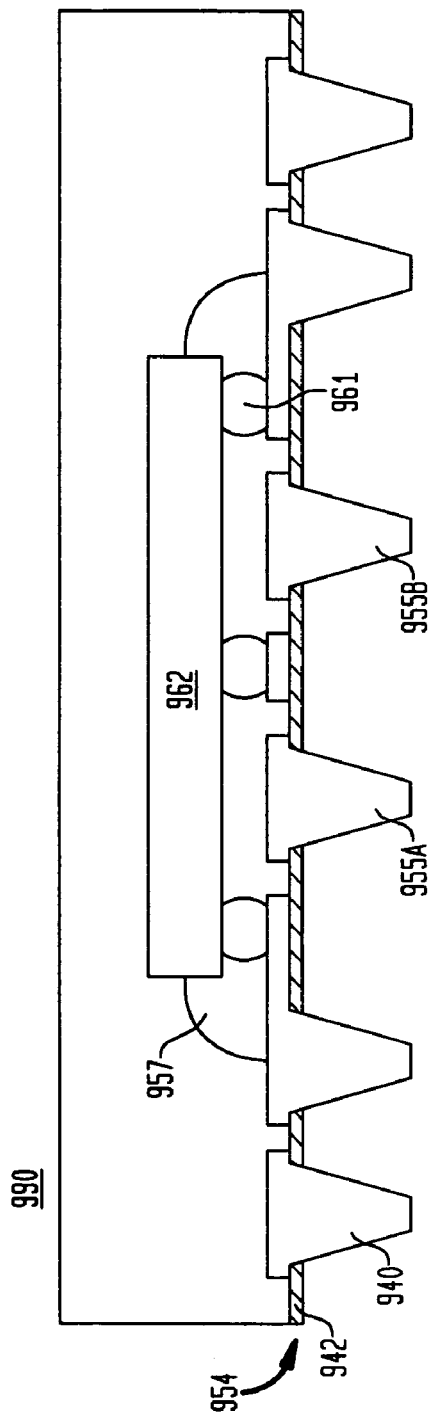
FIG. 11A shows a cross-sectional view of a microelectronic package, in accordance with yet further preferred embodiments of the present invention.
Figure 11B:
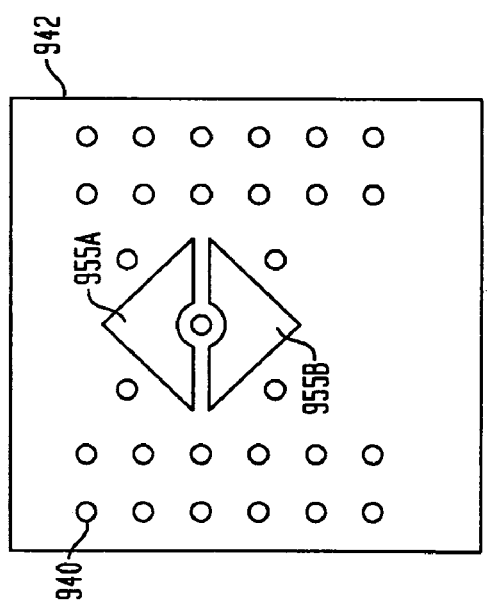
FIG. 11B shows a bottom plan view of the microelectronic package shown in FIG. 11A.

FIGS. 11A and 11B show a microelectronic package 990 that is generally similar to the package shown in FIGS. 10A and 10B. In the embodiment shown in FIGS. 11A and 11B, the package 990 includes two heat spreaders 955a and 955b that are in thermal communication with microelectronic element 962 using thermally conductive material 957. The package 990 includes microelectronic subassembly 954 having dielectric layer 942 and conductive posts 940. Some of the conductive posts 940 are electrically interconnected with microelectronic element 962 by conductive elements 961, such as solder balls.

FIGS. 12A and 12B show a microelectronic package 1090 in accordance with still further preferred embodiments of the present invention. The microelectronic package 1090 includes a microelectronic subassembly 1054 made of a two metal tape. The microelectronic subassembly 1054 has a dielectric substrate 1042 with a first surface 1044 and a second surface 1046. The dielectric substrate 1042 includes conductive metal provided over both the first surface 1044 and the second surface 1046. The metal is processed as described above to provide conductive features at both the first and second surfaces 1044, 1046 of the dielectric layer 1042. Microelectronic subassembly 1054 also includes a thermally conductive heat spreader 1055 that is adapted for removing heat from package 1090. Package 1090 also includes thermally conductive material 1057 in thermal communication with microelectronic element 1062 and heat spreader 1055. The thermally conductive material 1057 transfer heat between the microelectronic element 1062 and the heat spreader 1055. The microelectronic element 1062 is disposed in a face down orientation relative to the microelectronic subassembly 1054 and electrically interconnected with the microelectronic subassembly using conductive elements 1061 such as solder balls. In operation, the conductive posts 1040 are engaged with contact pads on the second microelectronic element for electrically interconnecting package 1090 with the second microelectronic element. In addition, heat spreader 1055 is preferably placed in thermal communication with a thermally conductive pad on the second microelectronic element for transferring heat from package 1090 to the thermally conductive pad on the second microelectronic element. Microelectronic package 1090 also includes a protective layer 1084 that encapsulates microelectronic element 1062 and covers first surface 1044 of dielectric layer 1042. The protective layer 1084 may be made of a rigid material such as an epoxy or glass. Protective layer 1084 may also be made of a compliant material such as an elastomer. The dielectric layer 1042 may be made of a flexible material so that the conductive posts 1040 may move independently of one another and relative to the microelectronic element 1062.

Figure 13A:
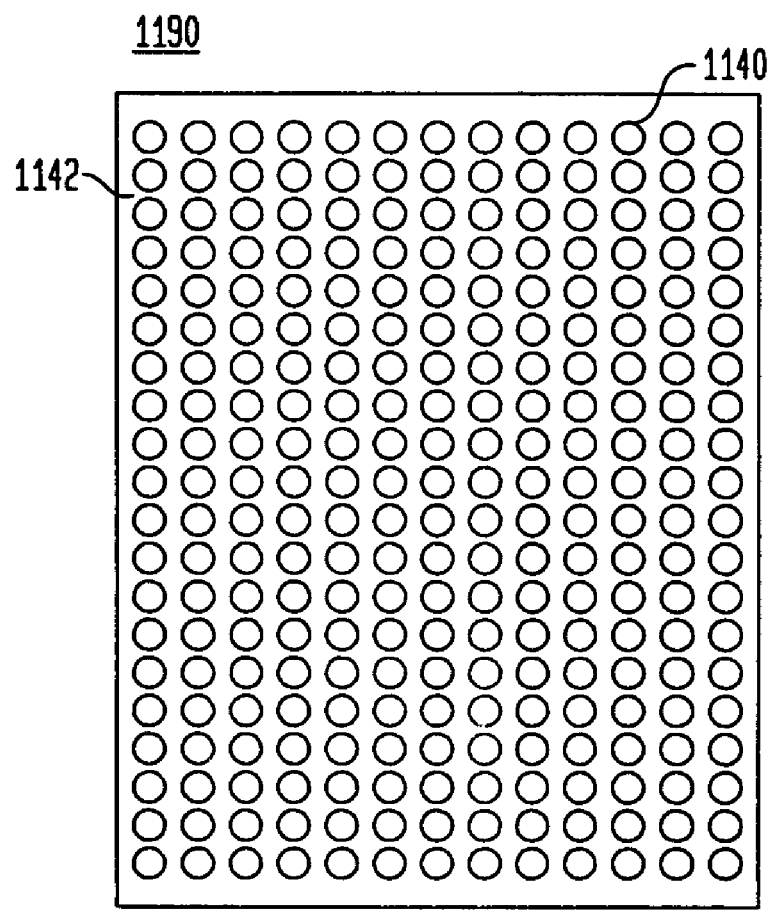
FIG. 13A shows a bottom plan view of a microelectronic package, in accordance with yet further preferred embodiments of the present invention.
Figure 13B:
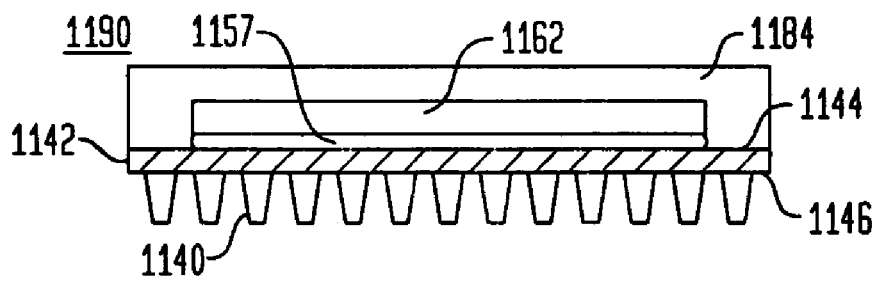
FIG. 13B shows a cross-sectional view of the microelectronic package shown in FIG. 13A.

FIGS. 13A and 13B show a microelectronic package 1190 in accordance with another preferred embodiment of the present invention. The microelectronic package 1190 includes a dielectric substrate 1142 having a first surface 1144 and a second surface 1146 remote therefrom. The package 1190 includes a plurality of conductive posts 1140 projecting from second surface 1146 of dielectric layer 1142. Package 1190 includes a microelectronic element 1162 such as a semiconductor chip that is electrically interconnected with the conductive posts 1140. The package includes a rigid adhesive 1157 for attaching microelectronic element 1162 to dielectric layer 1142. Package 1190 also includes a rigid overmold 1184 that encapsulates microelectronic element 1162 and covers first surface 1144 of dielectric layer 1142. The conductive posts 1140 are rigidly locked from movement. As a result, the conductive posts are unable to move relative to one another and relative to the microelectronic element 1162.

Figure 14A:
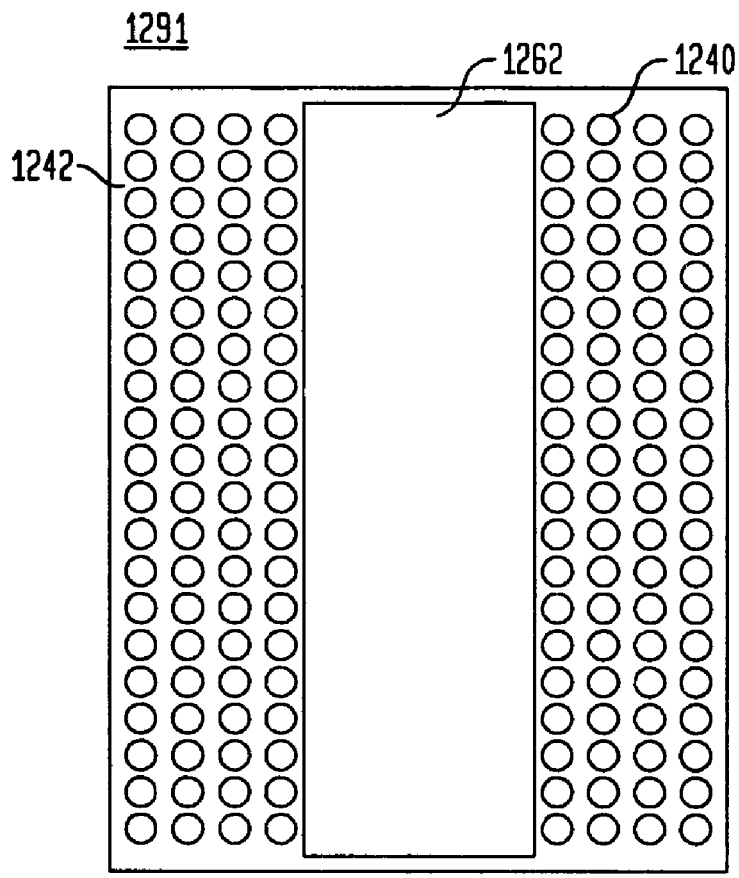
FIG. 14A shows a bottom plan view of a microelectronic assembly including a plurality of microelectronic packages stacked one atop another, in accordance with another preferred embodiments of the present invention.
Figure 14B:
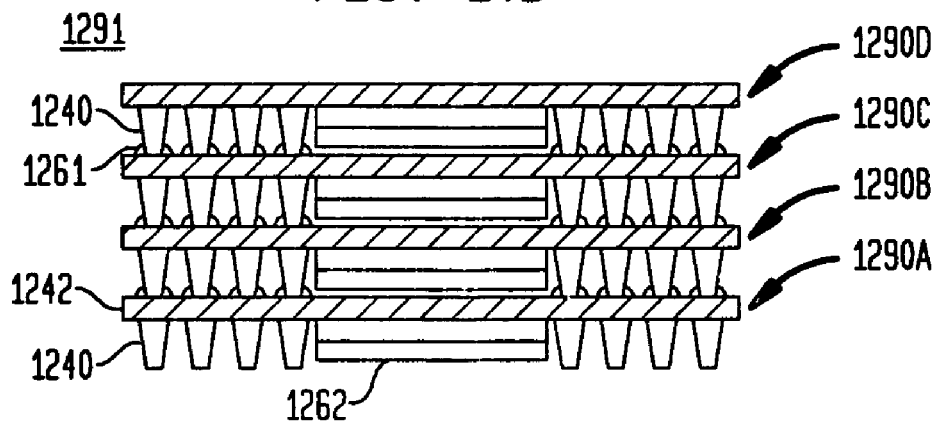
FIG. 14B shows a cross-sectional view of the microelectronic assembly shown in FIG. 14A.

FIGS. 14A and 14B show a microelectronic assembly 1291 including a plurality of microelectronic packages 1290a-1290d that are stacked one atop another. Each microelectronic package 1290 includes a dielectric layer 1242 having conductive posts 1240 projecting therefrom. Each microelectronic package 1290 also includes one or more microelectronic elements 1262 attached to dielectric layer 1242 and electrically interconnected with one or more of the conductive posts 1240. The dielectric layer 1242 may be flexible in certain preferred embodiments. In other preferred embodiments, the dielectric layer 1242 may be substantially rigid. The individual microelectronic packages 1290 are stacked one atop the other. In one particular embodiment, the conductive packages are stacked one atop the other so that the conductive posts 1240 of one package are in general alignment with the conductive posts of another package and so that the microelectronic elements 1262 are in general alignment with one another. The conductive posts 1240 of fourth microelectronic package 1290d are electrically interconnected with third microelectronic package 1290c using conductive material 1261 such as solder. The conductive material 1261 rigidly locks the conductive posts of an upper package to the substrate 1242 of a lower package. As a result, the conductive posts 1240 are rigidly locked from movement. In certain preferred embodiments, the conductive posts of second, third and fourth microelectronic packages 1290b-1290d may be rigidly locked, while the conductive posts of the first microelectronic package 1290a are free to move relative to one another.

Figure 15A:
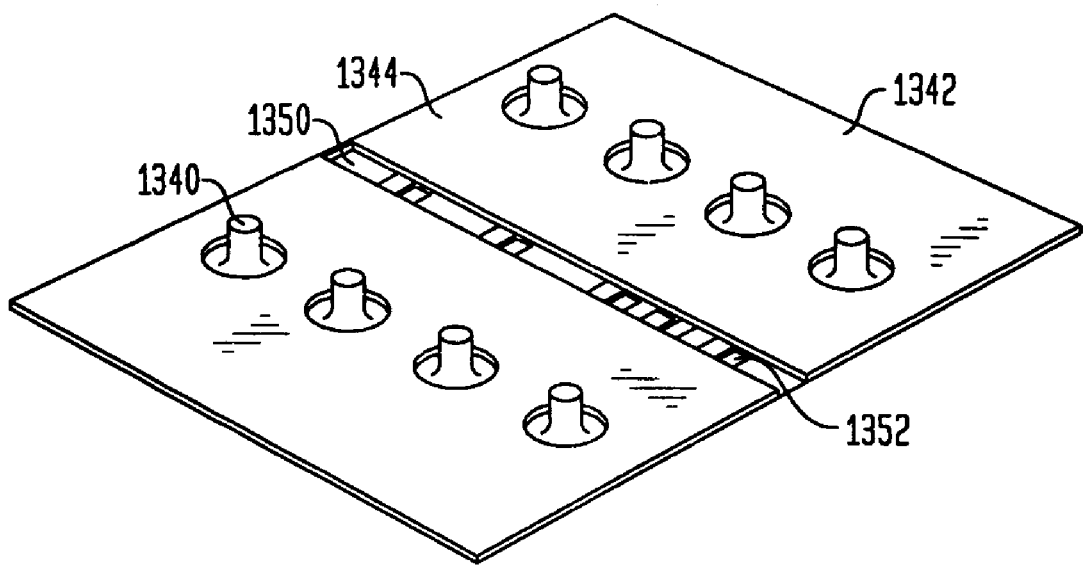
FIG. 15A shows a top perspective view of a dielectric substrate including conductive posts, in accordance with certain preferred embodiments of the present invention.
Figure 15B:
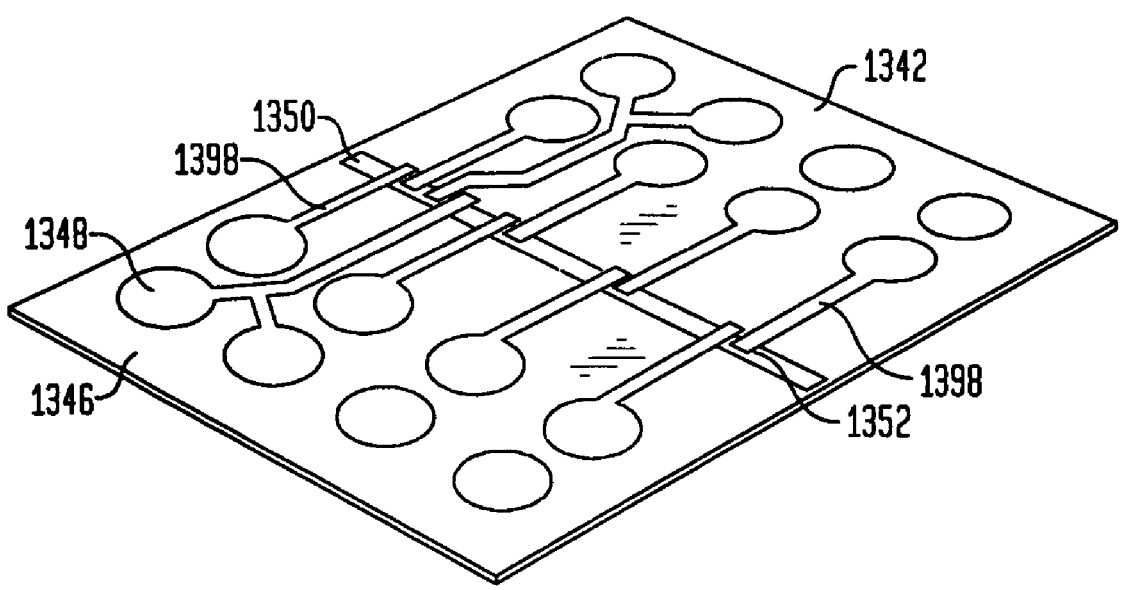
FIG. 15B shows a bottom perspective view of the dielectric substrate shown in FIG. 15A.

Referring to FIGS. 15A and 15B, in accordance with certain preferred embodiments of the present invention, a microelectronic assembly includes a dielectric substrate 1342 having a top surface 1344 and a bottom surface 1346. The microelectronic assembly includes conductive posts 1340 projecting from the first surface 1344 of the dielectric substrate. Referring to FIG. 15B, the microelectronic assembly also includes contact pads 1348 accessible at the second surface 1346 of the dielectric substrate 1342. At least some of the contact pads 1348 are electrically interconnected with conductive traces 1398 that extend from one of the respective contact pads 1348 to an elongated opening 1350 extending between first and second surfaces 1344, 1346 of the dielectric substrate 1342. At least some of the traces 1398 have a section 1352 that overlies the elongated opening 1350 of the dielectric substrate 1342.

Figure 16:
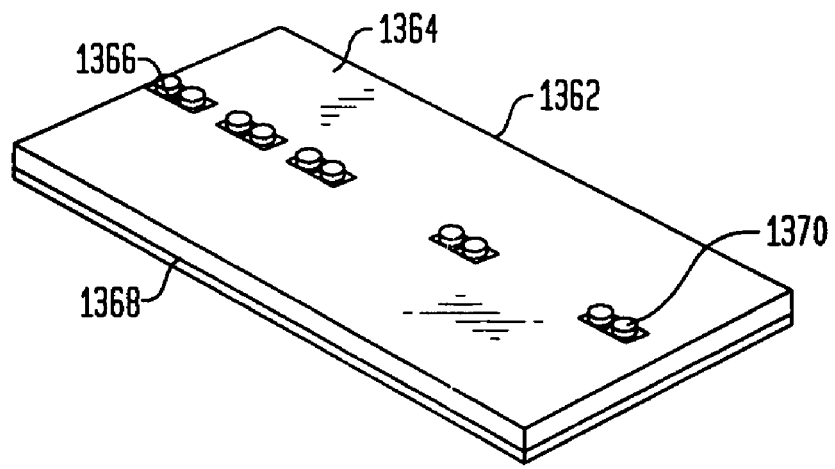
FIG. 16 shows a perspective view of a microelectronic element having contacts, in accordance with certain preferred embodiments of the present invention.

Referring to FIG. 16, the microelectronic subassembly also includes a microelectronic element 1362, such as a semiconductor chip, having a first face 1364 including contacts 1366 and a second face 1368 facing away from the first face 1364. The microelectronic element 1362 also includes conductive bumps 1370, such as solder or gold bumps, formed atop the contacts 1366. The bumps may be coined.

Figure 17:
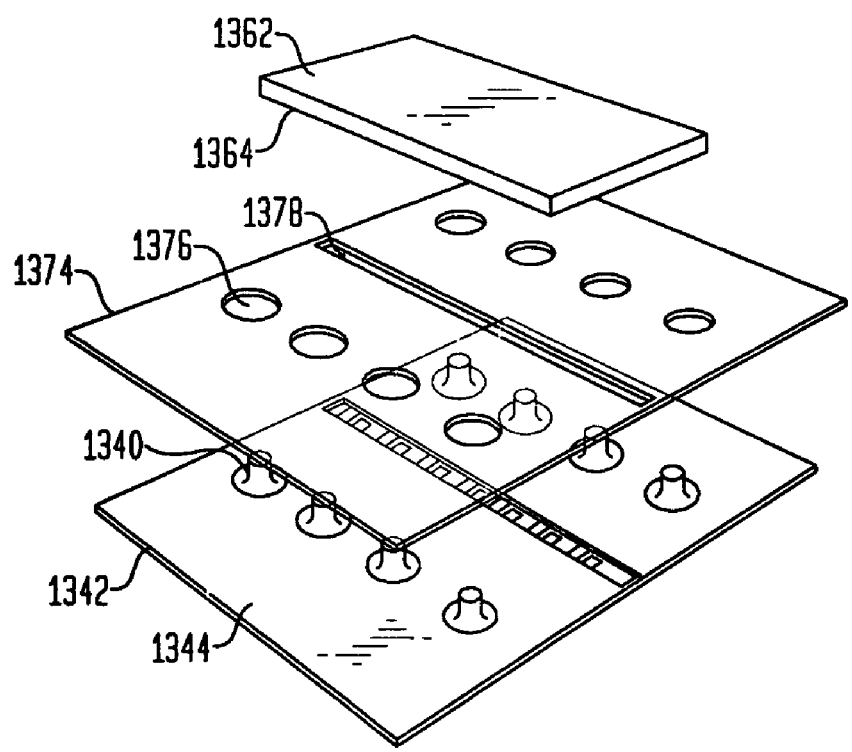
FIG. 17 shows the microelectronic element of FIG. 16 and an adhesive layer being assembled with the dielectric substrate of FIGS. 15A and 15B.

Referring to FIG. 17, the microelectronic element 1362 is assembled with the dielectric substrate 1342 by first positioning an adhesive layer 1374 between the first face 1364 of the microelectronic element 1362 and the first face 1344 of the dielectric substrate 1342. In the particular preferred embodiment shown in FIG. 17, the adhesive layer 1374 includes circular openings 1376 and an elongated opening 1378. The circular openings 1376 are preferably positioned to mirror the location of the conductive posts 1340 on dielectric substrate 1342. During assembly, the adhesive layer 1374 is preferably abutted against the top surface 1344 of dielectric substrate 1342 and the first face 1364 of microelectronic element 1362 is abutted against the adhesive layer 1374.

Figure 18A:
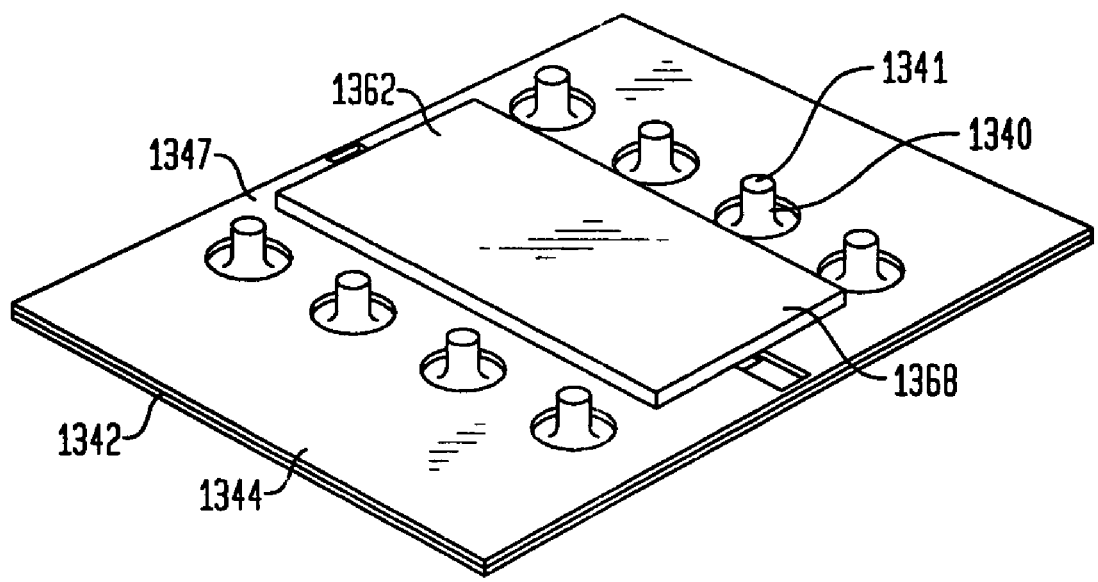
FIG. 18A shows a top perspective view of the dielectric substrate of FIG. 17 with the adhesive layer and the microelectronic element assembled therewith.

FIG. 18A shows the microelectronic assembly after the microelectronic element 1362, the adhesive layer 1374 and the dielectric substrate 1342 have been assembled together. In certain preferred embodiments, the upper ends 1341 of the conductive posts 1340 may extend above the second face 1368 of the microelectronic element 1362. As a result of being at a greater height above the first surface 1344 of the dielectric substrate 1342 than the microelectronic element 1362, the conductive posts may be easily connected to another microelectronic assembly substantially similar to the one shown in FIG. 18A. In other preferred embodiments, however, the upper ends 1341 of the conductive posts 1340 do not extend above the second face 1368 of the microelectronic element 1362. In these preferred embodiments, conductive masses may be positioned over the upper ends 1341 of the conductive posts 1340 to increase the height of the conductive posts and for making a reliable electrical interconnection.

Figure 18B:
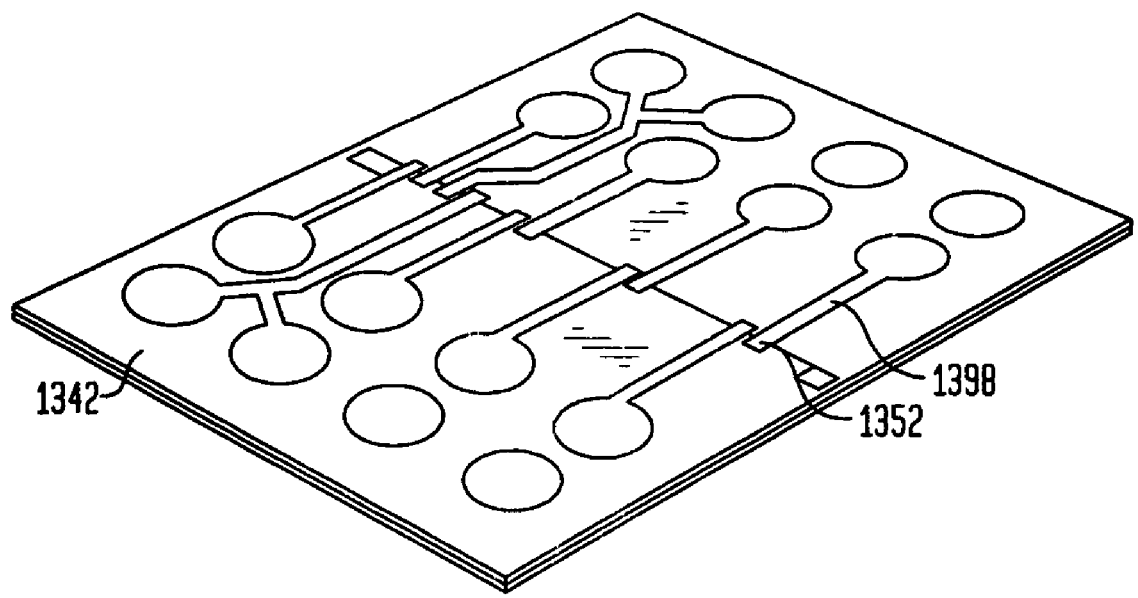
FIG. 18B shows a bottom view of the subassembly shown in FIG. 18A.

Referring to FIG. 18B, after the microelectronic element (not shown) has been assembled with the dielectric substrate 1342, the terminal ends 1352 of conductive traces 1398 are electrically interconnected with the contacts (not shown) of the microelectronic element. The electrical interconnection between the conductive traces 1398 and the contacts of the microelectronic element may be formed by any electrical interconnection method known to those skilled in the art including soldering, ultrasonic bonding and thermocompression bonding.

Figure 19A:
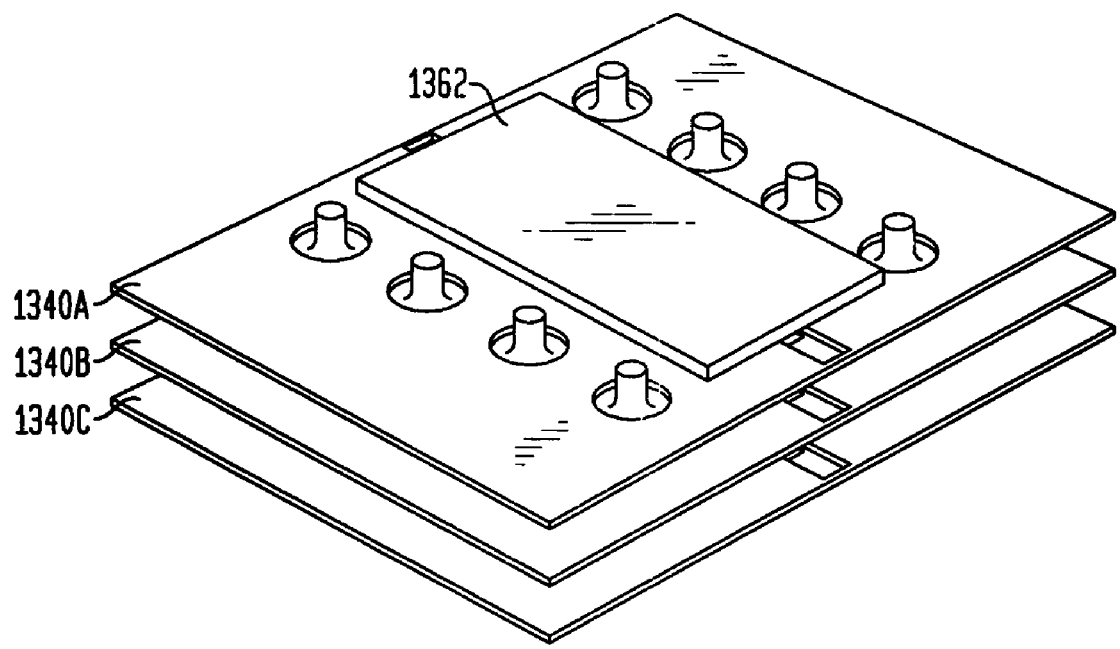
FIG. 19A shows a microelectronic stack including three of the units shown in FIG. 18A stacked one atop the other.

Referring to FIG. 19A, in certain preferred embodiments, two or more of the microelectronic assemblies 1340A-1340C are stacked atop one another. In a particular preferred embodiment shown in FIG. 19A, a first microelectronic assembly 1340A is stacked atop a second microelectronic assembly 1340B, which in turn is stacked atop a third microelectronic assembly 1340C. Preferably, the conductive posts (not shown) of the third microelectronic assembly 1340C are in contact with the contact pads (not shown) of the second microelectronic assembly 1340B. In turn, the conductive posts (not shown) of the second microelectronic assembly 1340B are in contact with the conductive pads (not shown) of the first microelectronic assembly 1340A. As a result, the microelectronic elements 1362 assembled with the dielectric substrates 1340A-1340C are electrically interconnected with one another. The three microelectronic assemblies 1340A-1340C are preferably substantially similar to one another in design and appearance. In other preferred embodiments, however, the three stacked microelectronic assemblies may differ substantially.

In order to program each of the microelectronic assemblies, the traces may undergo a process commonly referred to as "chip select" whereby the traces are cut or connected together. Preferred methods for carrying out the chip select process may include laser ablation, etching, punching and deposition of conductive material. As a result, the preferred path for the electrical interconnection of the conductive traces through the package may be programmed to meet the requirements of the package.

Figure 19B:
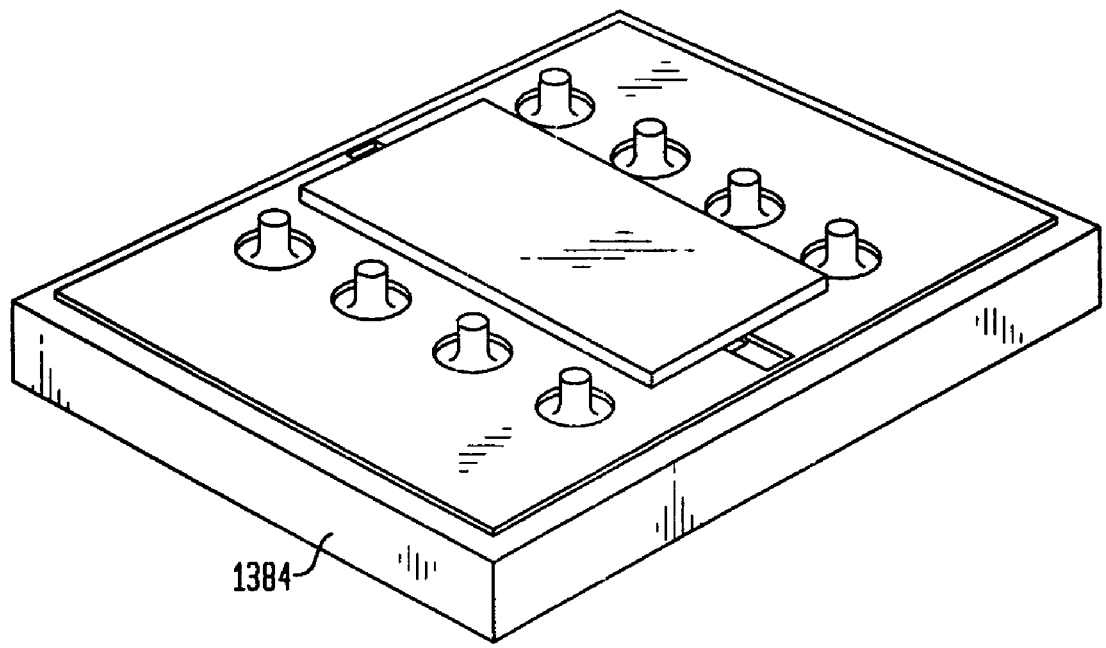
FIG. 19B shows the package of FIG. 19A with a protective layer formed thereon.

FIG. 19B shows the assembly of FIG. 19A after an overmold process. In certain preferred embodiments, the overmold 1384 may be an epoxy or glass. The overmold 1384 preferably protects the microelectronic assembly and provides stability during handling. The overmold 1384 may also enhance the reliability of the package during handling and operation. In certain preferred embodiments, the overmold is a rigid material, however, in other preferred embodiments the overmold may be somewhat or fully compliant. In other preferred embodiments, packages having only one dielectric substrate layer may be overmolded individually.

Figure 20:
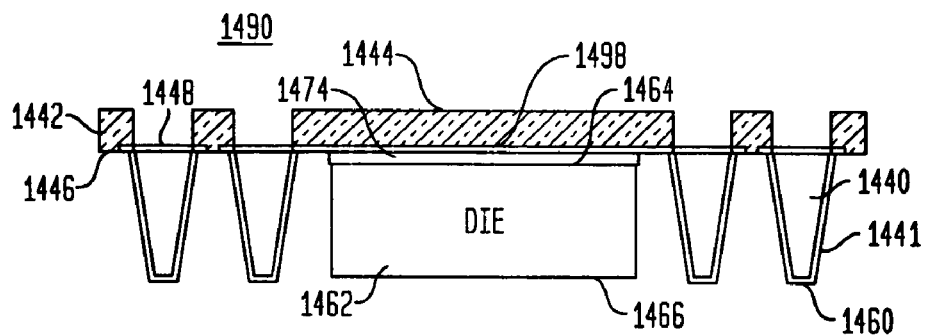
FIG. 20 shows a cross-sectional view of a microelectronic assembly including a dielectric layer, a microelectronic element assembled therewith and conductive posts projecting from the dielectric layer.

FIG. 20 shows a microelectronic assembly 1490 in accordance with another preferred embodiment of the present invention. The microelectronic assembly includes a dielectric substrate 1442 having a top or first surface 1444 and a bottom or second surface 1446 remote therefrom. The microelectronic assembly 1490 includes conductive traces 1498 formed atop the second surface 1446 of the dielectric substrate 1442. In other preferred embodiments, the conductive traces 1498 may be formed over only the first surface 1444, or over both the first surface 1444 and the second surface 1446. The microelectronic assembly 1490 also includes conductive pins or posts 1440 electrically interconnected with the conductive traces 1498 and projecting from the second surface 1446 of the dielectric substrate 1442. The conductive posts 1440 are preferably covered with a highly conductive material such as gold 1441. In certain preferred embodiments, the conductive posts have a diameter of approximately 50-200 microns and a length of approximately 50-200 microns. In more preferred embodiments, the tips of the conductive posts have a diameter of about 100 microns. The center-to-center pitch of the pins is preferably about 100-300 microns. In more preferred embodiments, the center-to-center pitch of the pins is about 225-275 microns and more preferably about 250 microns.

The microelectronic assembly 1490 also preferably includes a microelectronic element 1462 such as a semiconductor chip having a first contact bearing face 1464 and a second face 1466 remote therefrom. The microelectronic element 1462 preferably has a height of about 50-200 microns and more preferably a height that is less than 200 microns. The microelectronic element 1462 is assembled with the dielectric substrate 1442 using an underfill layer 1474, which may be made of an adhesive or encapsulant material. The microelectronic element 1462 can be connected with the dielectric substrate 1442 using wiring bonding, a flip-chip methodology or other well-known methods for attaching die to a circuitized substrate. After the microelectronic element 1462 has been assembled with the dielectric substrate 1442, the lower ends 1460 of the conductive posts 1440 preferably project beyond the second face 1466 of the microelectronic element 1462.

The microelectronic assembly 1490 preferably has a height that extends from the first surface 1444 of the dielectric substrate 1442 to the tips 1460 of the conductive posts 1440. In certain preferred embodiments, the height of the microelectronic assembly is about 75-300 microns and more preferably between about 100-200 microns.

Figure 21:
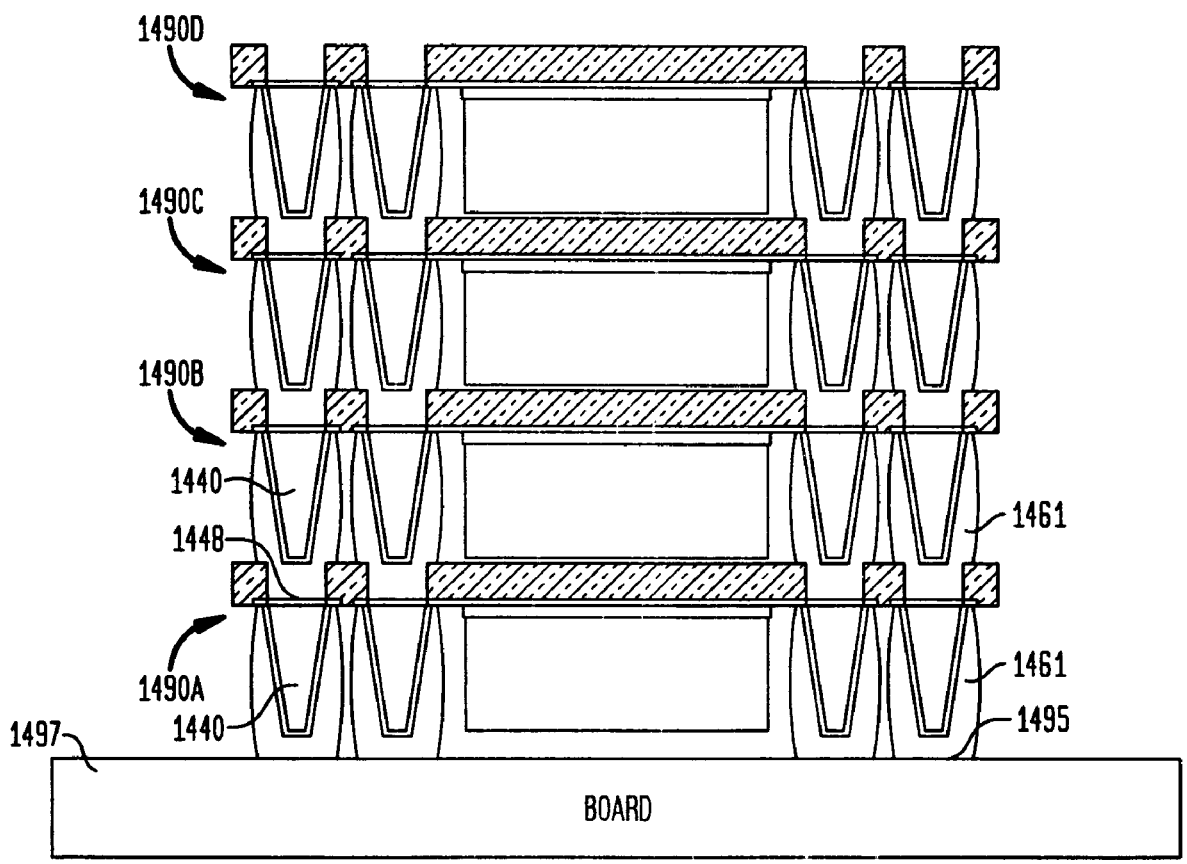
FIG. 21 shows a plurality of the microelectronic assemblies of FIG. 20 stacked one atop another and connected with a printed circuit board, in accordance with certain preferred embodiments of the present invention.

Referring to FIG. 21, a microelectronic stack may be assembled by utilizing two or more of the microelectronic assemblies 1490 shown in FIG. 20. In FIG. 21, the conductive posts 1440 of a first microelectronic assembly 1490A are electrically interconnected with contacts 1495 on a printed circuit board 1497 utilizing conductive material 1461 such as solder. The conductive material is preferably positioned atop the conductive pads 1448 provided on the dielectric substrate 1442. A second microelectronic assembly 1490B is preferably assembled over the first microelectronic assembly 1490A so that the conductive posts 1440 of the second microelectronic assembly 1490B are in electrical contact with the conductive pads 1448 of the first microelectronic assembly 1490A. Once again, the conductive posts 1440 of the second microelectronic assembly 1490B are secured to the conductive pads 1448 of the first microelectronic assembly 1490A using conductive material 1461 such as solder. The process is repeated with a third microelectronic assembly 1490C assembled atop the second microelectronic assembly 1490B and a fourth microelectronic assembly 1490D assembled atop the third microelectronic assembly 1490C. The stacked assembly may be assembled together before the conductive posts 1440 of the first microelectronic assembly 1490A are electrically interconnected with the contacts of the printed circuit board 1497. In other preferred embodiments, the microelectronic stack can be assembled atop the printed circuit board 1497.

In still other preferred embodiments, an overmold may be provided over one or more layers of the stack either before or after assembly of the microelectronic assemblies with the printed circuit board 1497. In one preferred embodiment, the microelectronic assemblies are overmolded individually before they are assembled together in a stack. In other preferred embodiments, the microelectronic assemblies are arranged in a stack, overmolded, and then connected with another circuit element such as a printed circuit board. In still other preferred embodiments, the microelectronic elements are assembled in a stack atop the printed circuit board and then the entire stack is overmolded.

Figure 22:
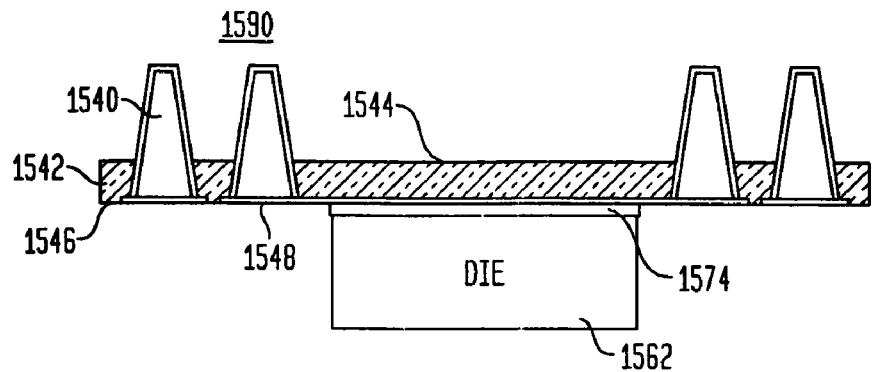
FIG. 22 shows a cross-sectional view of a microelectronic assembly including a dielectric layer, a microelectronic element assembled with the dielectric layer, and a plurality of conductive posts projecting from the dielectric layer.
Figure 23:
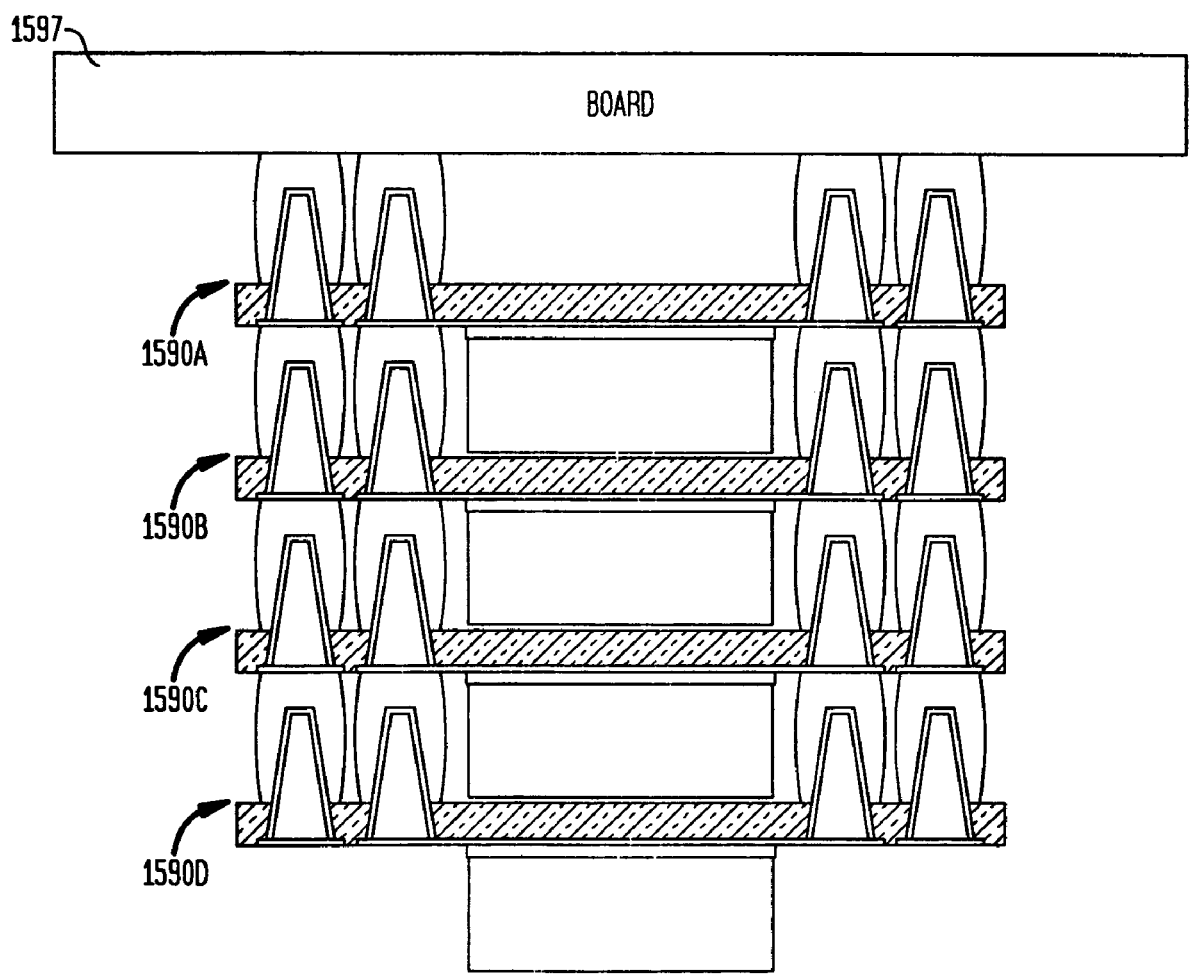
FIG. 23 shows a plurality of the microelectronic assemblies of FIG. 22 stacked one atop the other and connected with a printed circuit board, in accordance with certain preferred embodiments of the present invention.

Referring to FIGS. 22 and 23, in another preferred embodiment of the present invention, a microelectronic assembly 1590 includes a dielectric substrate 1542 having a first surface 1544 and a second surface 1546 remote therefrom. The microelectronic assembly includes conductive traces 1574 provided over the second surface 1546 of the dielectric substrate 1542. The microelectronic assembly 1590 also includes conductive pads 1548 electrically interconnected with the respective conductive traces 1574. The microelectronic assembly 1590 also includes conductive pins or posts 1540 projecting above the first surface 1544 of the dielectric substrate 1542. In the particular preferred embodiment shown in FIG. 22, the conductive posts extend through the dielectric substrate 1542. The microelectronic assembly 1590 includes a microelectronic element 1562 assembled with the dielectric substrate 1542 using an encapsulant or adhesive layer 1574 positioned between the microelectronic element 1562 and the second surface 1546 of the dielectric substrate 1542. The encapsulant or adhesive layer may cover conductive contacts or bumps provided on the microelectronic element.

Referring to FIG. 23, two or more of the microelectronic assemblies 1590A-1590D are stacked one atop the other to make a microelectronic stack. The assembled stack is then electrically interconnected with a printed circuit board 1597. In certain preferred embodiments, the entire stack assembly may be overmolded using materials such as epoxy or glass. The overmold material may be rigid or compliant, or have a hardness somewhere between a rigid material and a compliant material.

Figure 24:
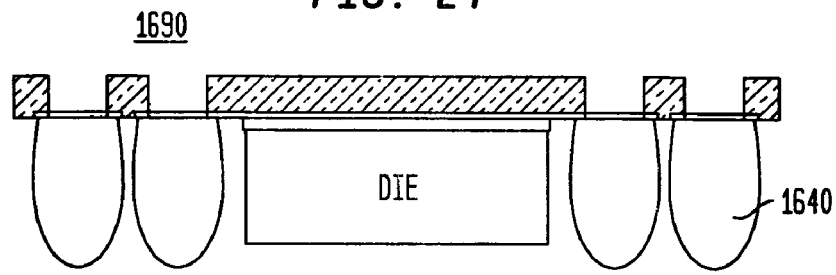
FIG. 24 shows a cross-sectional view of a microelectronic assembly including a dielectric layer, a microelectronic element assembled with a dielectric layer, and conductive elements attached to the dielectric layer.
Figure 25:
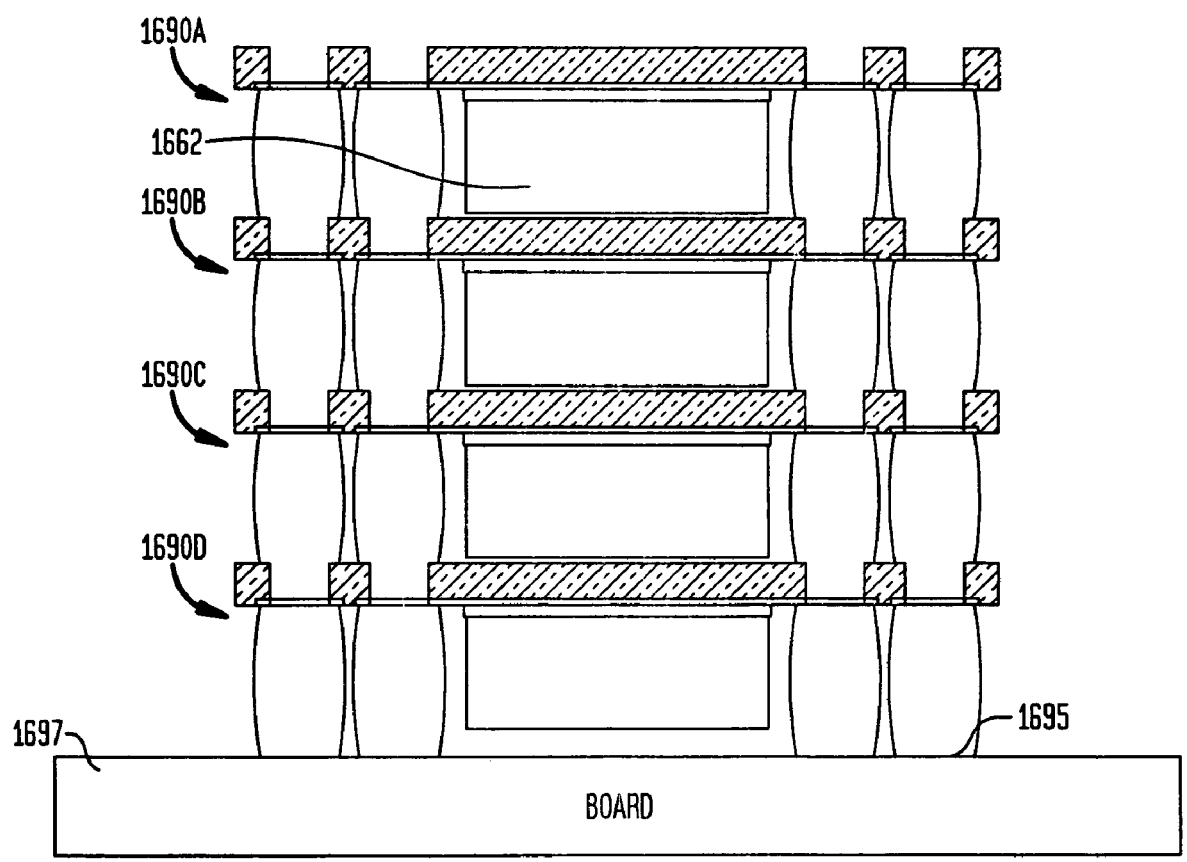
FIG. 25 shows a plurality of the microelectronic assemblies shown in FIG. 24 stacked one atop the other, and with the bottom most subassembly in the stack being connected with a printed circuit board, in accordance with certain preferred embodiments of the present invention.

FIG. 24 shows a microelectronic assembly 1690 that is substantially similar to the assembly shown in FIG. 20. In a particular assembly shown in FIG. 24, the conductive posts shown in FIG. 20 have been replaced with conductive elements 1640 such as solder balls. Referring to FIG. 25, two or more of the microelectronic assemblies 1690 are stacked atop one another to form a stacked assembly. The lowermost assembly in the stack, shown as assembly 1690D, is directly connected to contact 1695 on a printed circuit board 1697. The remaining microelectronic assemblies 1690A-1690C are stacked atop the lowermost microelectronic assembly 1690. The microelectronic elements 1662 are preferably electrically interconnected with one another.

Figure 26:
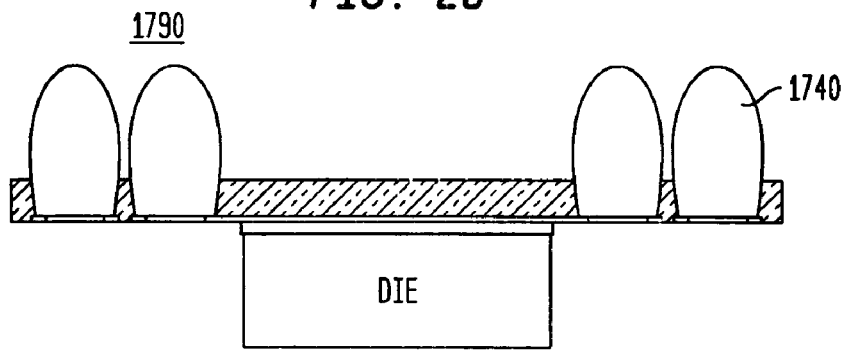
FIG. 26 shows a cross-sectional view of a microelectronic assembly including a dielectric sheet having a microelectronic element assembled therewith and conductive elements projecting from the dielectric sheet.
Figure 27:
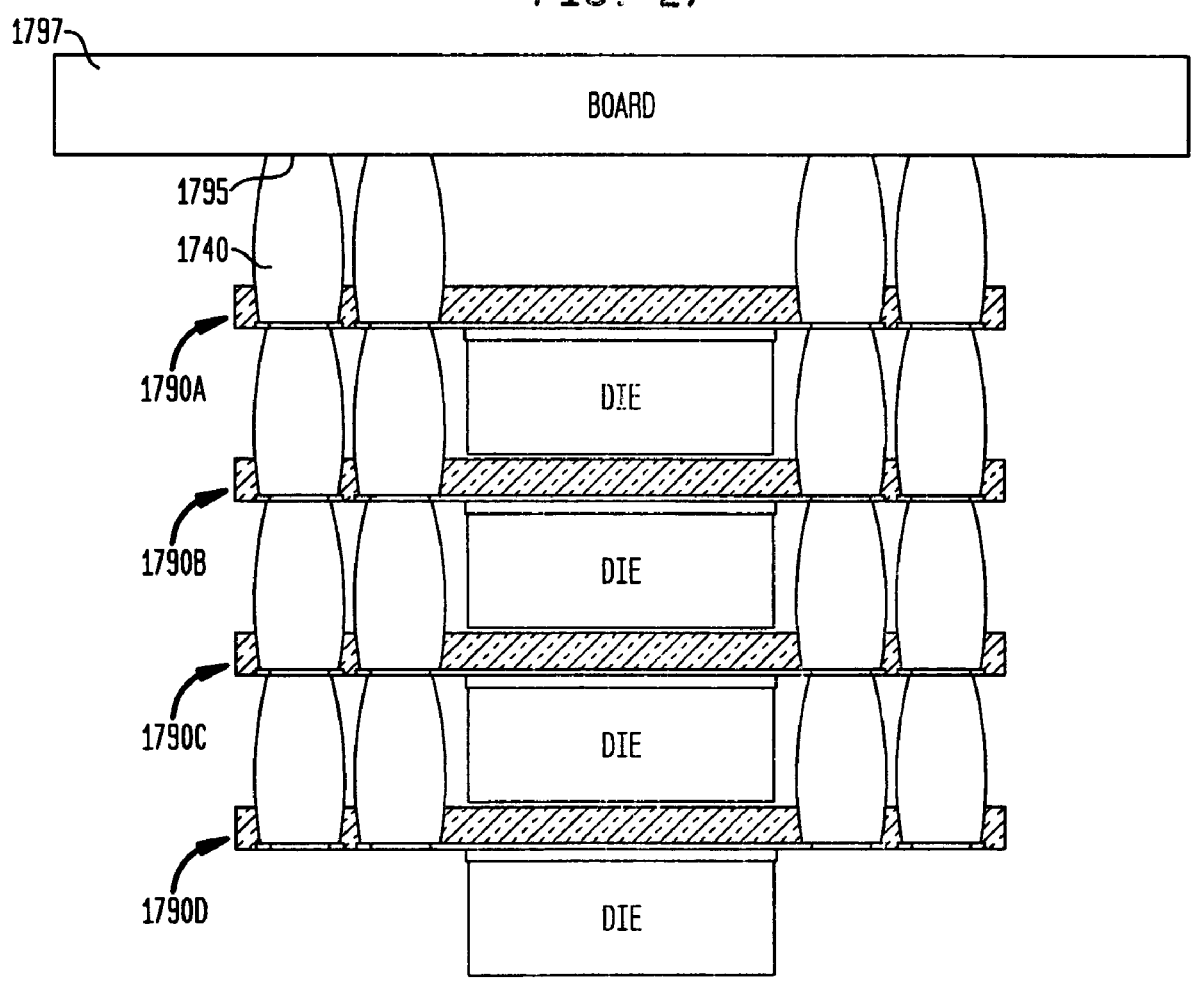
FIG. 27 shows a plurality of the microelectronic assemblies of FIG. 26 stacked one atop the other with the uppermost element in the stack being connected with a printed circuit board, in accordance with certain preferred embodiments of the present invention.

Referring to FIG. 26, a microelectronic assembly 1790 in accordance with another preferred embodiment of the present invention is generally similar to the assembly shown in FIG. 22. The assembly 1790 of FIG. 26 uses conductive elements 1740 such as solder balls rather than the conductive posts shown in the FIG. 22 embodiment. Referring to FIG. 27, a stacked assembly may be made by stacking two or more of the microelectronic assemblies 1790 atop one another. In FIG. 27, four microelectronic assemblies 1790A-1790D are stacked atop one another. The uppermost microelectronic assembly 1790A is electrically interconnected with contacts 1795 of printed circuit board 1797 through conductive elements 1740.

Figure 28A:
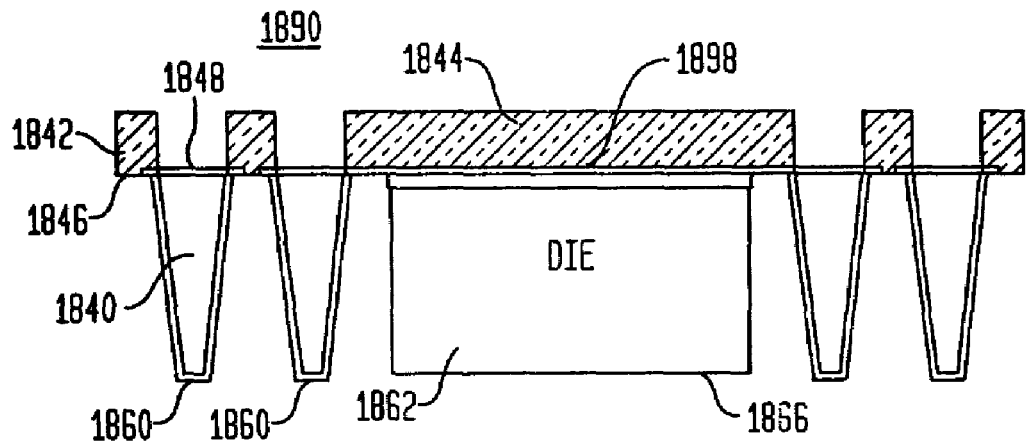
FIG. 28A shows a cross-sectional view of a microelectronic assembly, in accordance with another preferred embodiment of the present invention.
Figure 28B:
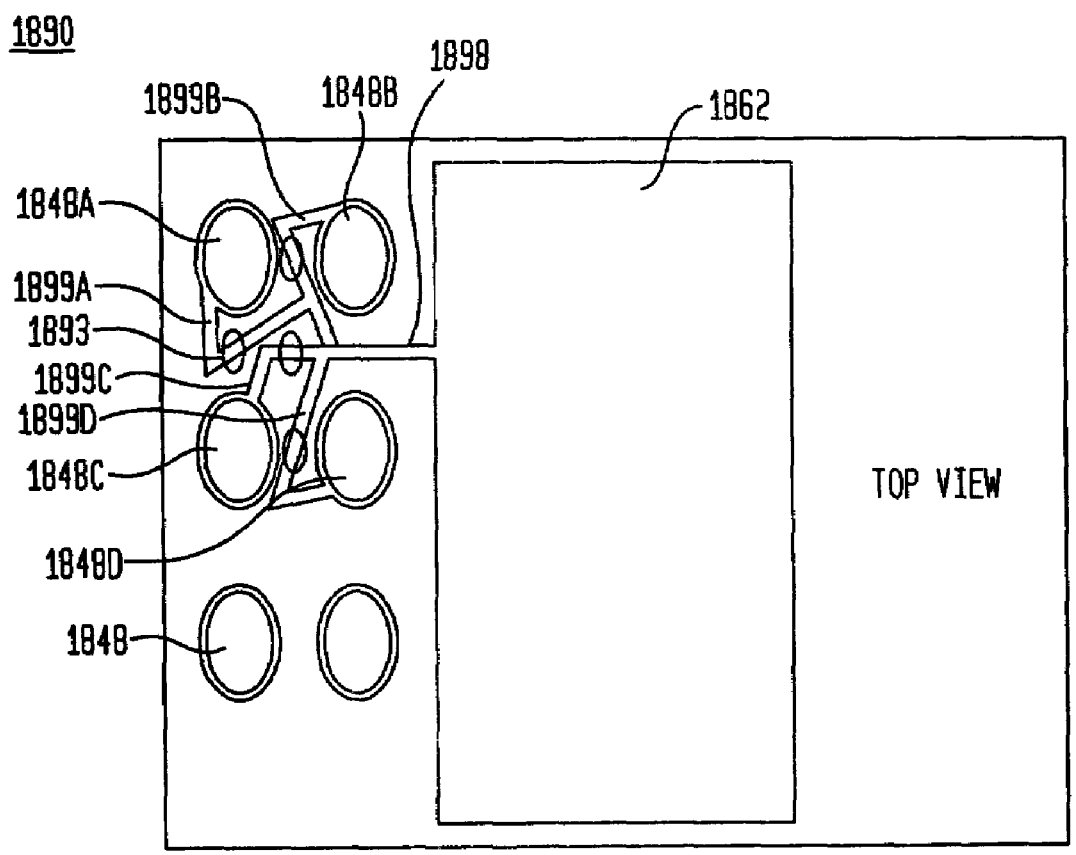
FIG. 28B shows a top plan view of the microelectronic assembly shown in FIG. 28A.

FIGS. 28A and 28B show a microelectronic assembly that may be programmed by breaking the conductive traces extending over the dielectric substrate of the assembly. Referring to FIG. 28A, a microelectronic assembly 1890 includes a dielectric substrate 1842 having a first surface 1844 and a second surface 1846 remote therefrom. The microelectronic assembly 1890 includes conductive traces 1898 extending over the second surface 1846 of the dielectric substrate 1842. The conductive traces have first ends that are electrically interconnected with contacts on microelectronic element 1862 and second ends that terminate at conductive pads 1848. The microelectronic assembly 1890 also includes conductive posts 1840 that are electrically interconnected with the conductive pads 1848 and then project from the second surface 1846 of dielectric substrate 1842. The lowermost tips 1860 of the respective conductive posts 1840 preferably extend below the second face 1866 of microelectronic element 1862. In other preferred embodiments, however, the tips 1860 may not extend below the second surface 1866 of microelectronic element 1862. In these particular embodiments, an electrical interconnection may be formed by using a conductive mass, such as solder, at the tips 1860. The conductive masses preferably increase the overall height of the conductive posts 1840 so that a reliable electrical interconnection may be formed.

Referring to FIG. 28B, the microelectronic assembly 1890 includes a plurality of conductive pads 1848 formed thereon. As shown in FIG. 28A, the conductive pads 1848 are electrically interconnected with and in substantial alignment with the conductive posts 1840. In other preferred embodiments, the conductive pads 1848 may not be in alignment with the conductive posts 1860. In still other preferred embodiments, the conductive pads 1848 may be in slight alignment with the conductive posts 1860.

Referring to FIG. 28B, the microelectronic assembly 1890 includes a main trace 1898 that is electrically interconnected with microelectronic element 1862. The main trace is electrically interconnected with four branch traces 1899A-1899D. Although only one main trace is shown in FIG. 28B, a microelectronic assembly may have a plurality of main traces connected to respective branch traces. A first branch trace 1899A is electrically interconnected with first conductive pad 1848A, and a second branch trace 1899B is electrically interconnected with second conductive pad 1848B. A third branch trace 1899C is electrically interconnected with a third conductive pad 1848C, and a fourth branch trace 1899D is electrically interconnected with a fourth conductive pad 1848D. Each of the branch traces 1899 includes a cuttable section 1893 that may be cut for electrically isolating one or more of the conductive pads 1848 from the main trace 1898.

Figure 28C:
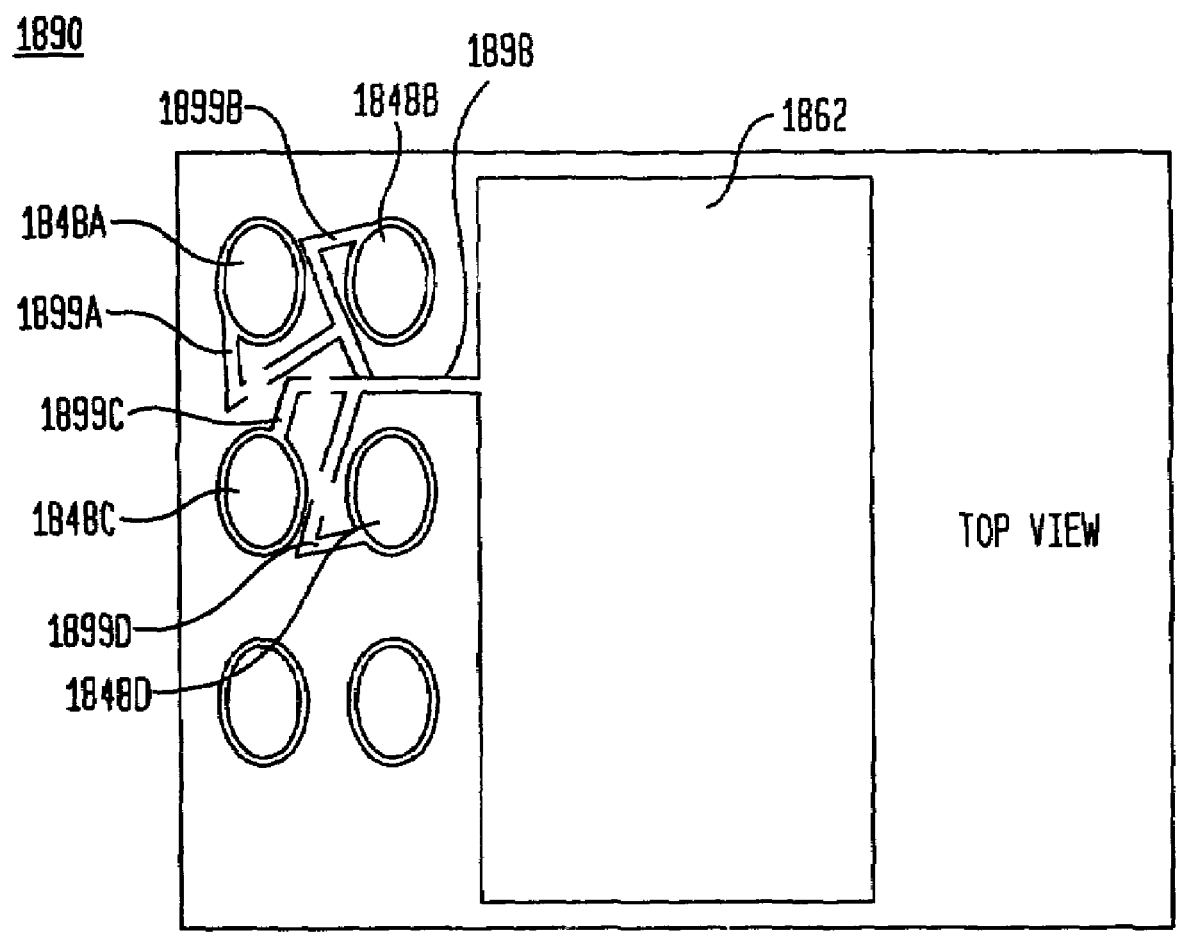
FIG. 28C shows the assembly of FIG. 28B with conductive traces broken, in accordance with certain preferred embodiments of the present invention.

Referring to FIG. 28C, in order to program the microelectronic assembly 1890, one or more of the branch traces 1899 are cut for electrically isolating one or more of the conductive pads 1848 from the main trace 1898. In FIG. 28C, the first branch trace 1899A, the third branch trace 1899C, and the fourth branch trace 1899D, are cut at cuttable sections 1893. As a result, the first conductive pad 1848A, the third conductive pad 1848C and the fourth conductive pad 1848D are electrically isolated from the main trace 1898 and the microelectronic element 1862. Only second conductive pad 1848B remains electrically interconnected with microelectronic element 1862 through second branch trace 1899B and main trace 1898. As is well known to those skilled in the art, the branch traces may be cut or remain electrically connected with the microelectronic element 1862 for forming an infinite number of programmed microelectronic assemblies. The number of branch traces may be more than the four shown in FIG. 28B.

A plurality of microelectronic assemblies shown in FIG. 28C may be stacked atop one another to form a stacked assembly. The entire assembly may be overmolded, such as by using an epoxy or glass, as described above.

Figure 29A:
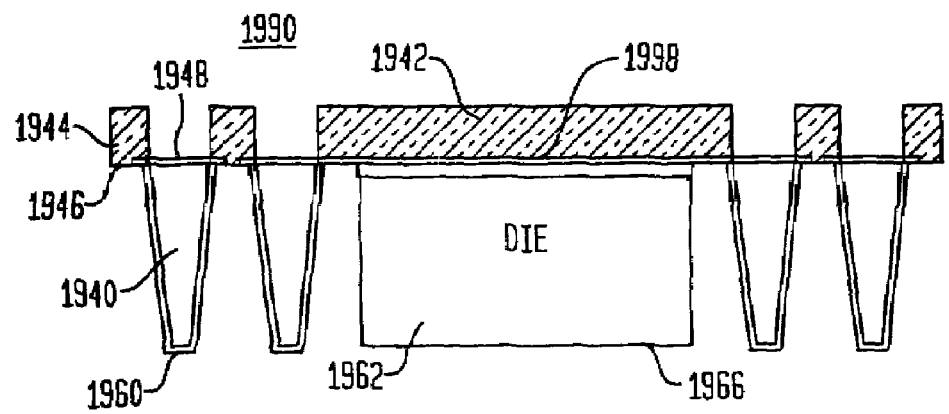
FIG. 29A shows a cross-sectional view of a microelectronic assembly including a dielectric layer, a microelectronic element assembled with the dielectric layer and conductive post projecting from the dielectric layer.
Figure 29B:
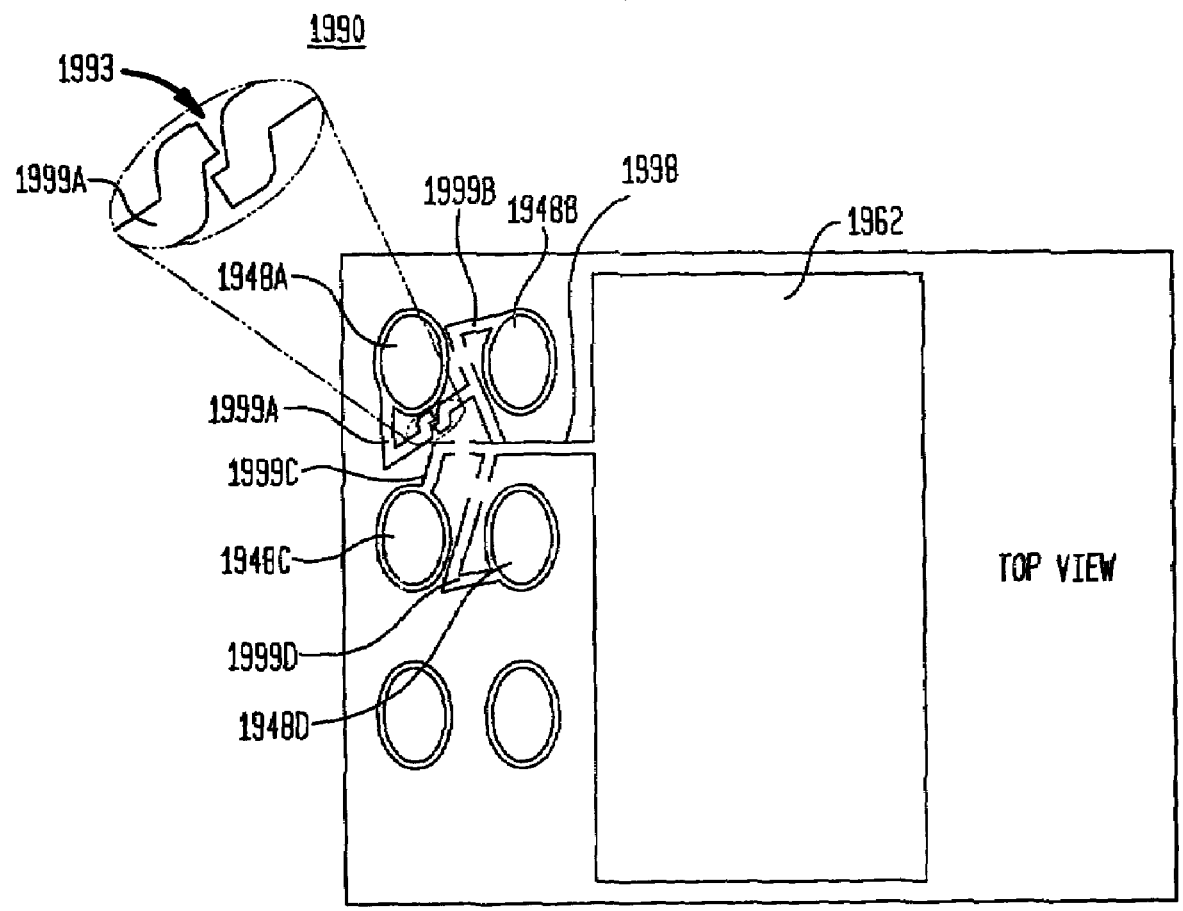
FIG. 29B shows a top plan view of the microelectronic assembly shown in FIG. 29A.
Figure 29C:
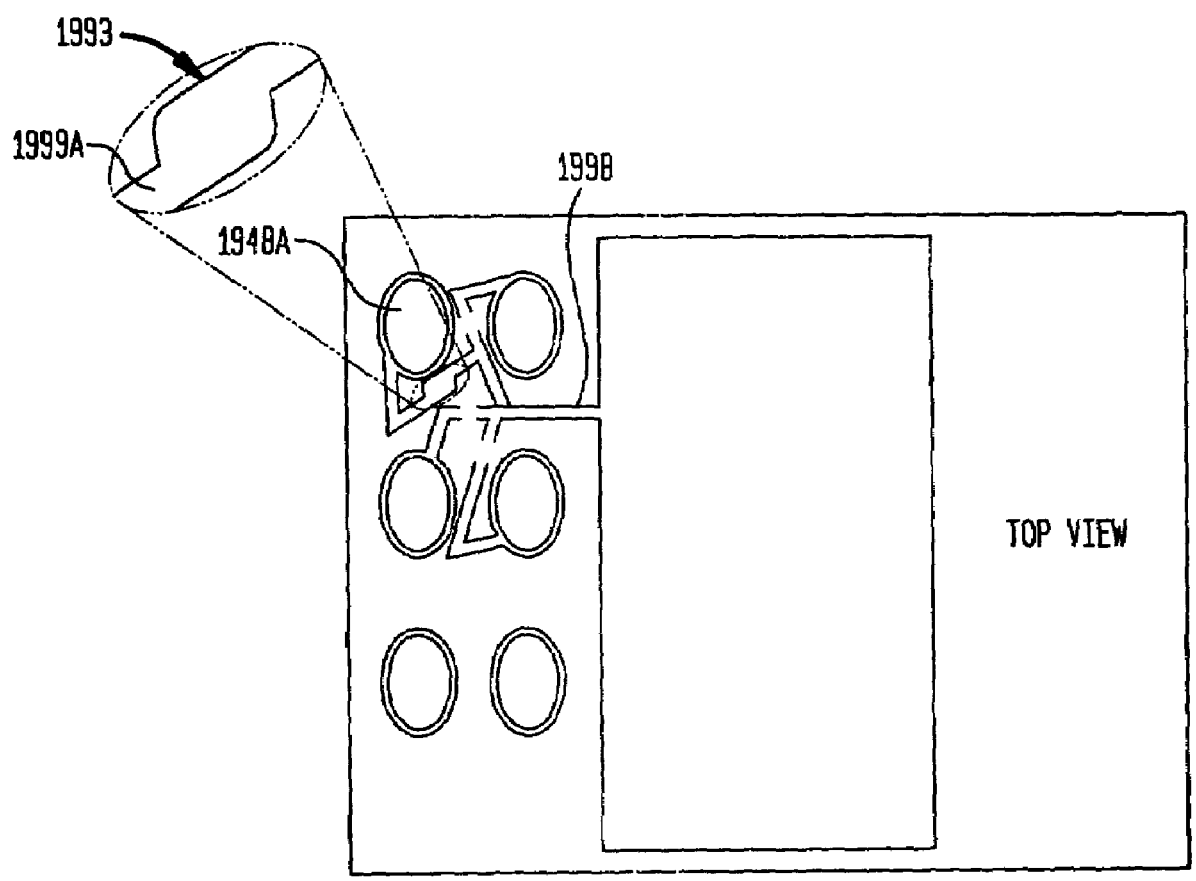
FIG. 29C shows another view of the microelectronic assembly shown in FIG. 29BA with a conductive trace connected to a main trace, in accordance with certain preferred embodiments of the present invention.

FIGS. 29A-29C show a programmable microelectronic assembly, whereby the assembly is programmed by forming an electrical interconnection between branch traces and a main trace. This is the opposite of what was shown in FIGS. 28A-28C whereby the microelectronic assembly was programmed by severing or cutting the branch traces.

Referring to FIG. 29A, microelectronic assembly 1990 includes dielectric substrate 1942 having a first surface 1944 and a second surface 1946 remote therefrom. The microelectronic assembly includes conductive traces 1998 formed over the second surface 1946 of the dielectric substrate 1942. The conductive traces have first ends (not shown) electrically interconnected with the microelectronic element 1962 and outer ends that may be electrically interconnected with conductive pads 1948. The microelectronic assembly 1990 also includes conductive posts 1940 that project from the second surface 1946 of the dielectric substrate 1942. The conductive posts 1940 include tip ends 1960 that extend below a second surface 1966 of microelectronic element 1962. In other preferred embodiments, however, the tip ends 1960 of the conductive post 1940 may not extend below the second surface 1966 of the microelectronic element 1962.

Referring to FIG. 29B, the microelectronic assembly 1990 may be programmed by electrically interconnecting one or more of the branch traces 1999 with a main trace 1998. In the particular preferred embodiment shown in FIG. 29B, the microelectronic assembly 1990 has a first conductive pad 1948A that is electrically interconnected with a first branch trace 1999A, a second conductive pad 1948B that is electrically interconnected with a second branch trace 1999B, a third conductive pad 1948C that is electrically interconnected with a third branch trace 1999C, and a fourth conductive pad 1948D that is electrically interconnected with a fourth branch trace 1999D. Each of the branch traces 1999A-1999D, however, is electrically isolated from main trace 1998. As shown in the magnified section of FIG. 29B, the first branch trace 1999A is electrically isolated from the main trace 1998 at an isolation section 1993.

Referring to FIG. 29C, the conductive pads may be electrically interconnected with the microelectronic element 1962 by electrically interconnecting one or more of the branch traces with the main trace. In the particular embodiment shown in FIG. 29C, first conductive pad 1948A is electrically interconnected with main trace 1998 by connecting first branch trace 1999A with main trace 1998. This may be accomplished by joining the branch trace 1999A with the main trace 1998, such as by lead bonding, wire bonding, depositing a conductive material, or other well-known methods for forming an electrical interconnection.

In another preferred embodiment of the present invention, a first microelectronic assembly 2010 includes a semiconductor chip 2012 having a front face 2014 and a rear face 2016 remote therefrom. The semiconductor chip 2012 also includes contacts 2018 exposed at the front face 2014 thereof. An elongated, conductive post 2020 is electrically connected with contact 2018 and projects away from front face 2014 of semiconductor chip 2012.

Figure 30:
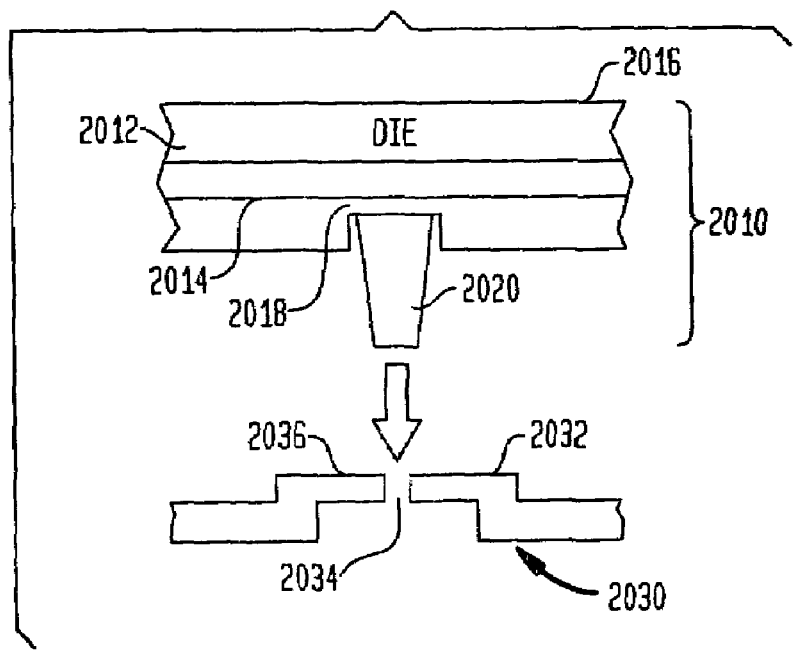
FIG. 30 shows a cross sectional view of a first microelectronic assembly being electrically interconnected with a second microelectronic assembly, in accordance with certain preferred embodiments of the present invention.
Figure 32:
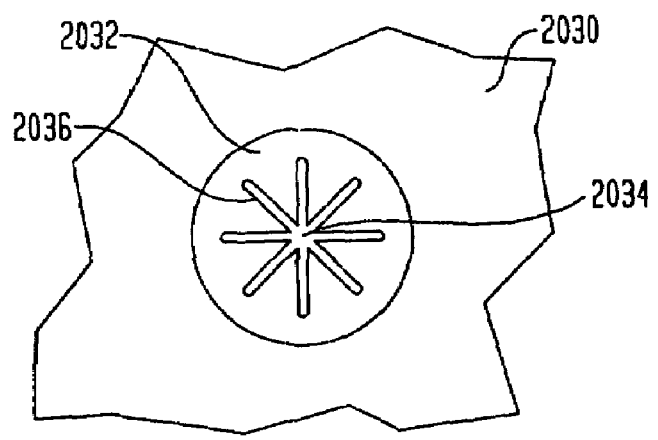
FIG. 32 shows a top plan view of the second microelectronic assembly of FIG. 30, including a socket having a central opening and flexible projections.

Referring to FIGS. 30 and 32, a second microelectronic assembly 2030 includes a plurality of sockets 2032 provided thereon. The sockets preferably have a central opening 2034 and flexible projections 2036 that extend inwardly toward the central opening 2034. The flexible projections 2036 are able to flex in response to forces being exerted thereupon. The second microelectronic assembly may have conductive posts that are insertible into the conductive sockets of a third microelectronic assembly.

Figure 31:
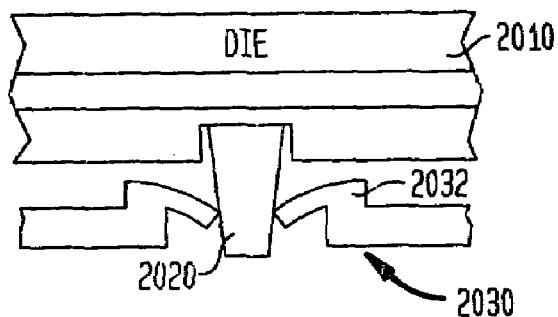
FIG. 31 shows a cross sectional view of the embodiment shown in FIG. 30, after the first and second microelectronic assemblies have been connected together.

Referring to FIGS. 30 and 31, the first and second microelectronic assemblies 2010 and 2030 are electrically interconnected with one another to form a stacked assembly. As shown in FIGS. 30 and 31, the elongated, conductive post 2020 of the first assembly 2010 is inserted into the socket 2032 of second microelectronic assembly 2030. As the conductive post 2020 is inserted into the socket 2032, the flexible projections 2036 flex away from one another as shown in FIG. 31.

The embodiment shown in FIGS. 30-32 shows only two microelectronic assemblies being stacked and electrically interconnected together, however, a plurality of microelectronic elements may be assembled and electrically interconnected in a vertical array in a similar manner. Thus, the present invention contemplates that three, four or more microelectronic assemblies may be vertically stacked one on top of another and electrically interconnected by inserting elongated, conductive post into flexible sockets of an underlying or overlying microelectronic assembly. In still another preferred embodiment, a microelectronic assembly may have conductive posts extending above and below the assembly for electrically interconnecting with the sockets of other microelectric assemblies above and below.

Although the present invention is not limited by any particular theory of operation, it is believed that a plurality of microelectronic assemblies may be snapped fit or plugged together. As a result, a stacked microelectronic assembly may be reliably tested without requiring a high temperature reflow process. In certain preferred embodiments, a conductive solution may be placed on the conductive posts or pins or the sockets before insertion to improve electrical conductivity and the reliably of the assembly. As such, a stacked microelectronic assembly may be easily tested. If one or more of the components does not operate efficiently, that particular component may be removed and the assembly reformed by snap fitting or plugging the individual microelectronic components together. Such an approach eliminates at least one reflow cycle, thereby increasing reliability and decreasing defective components. The present inventions also enables an stack package to be quickly unassembled and reassembled with one or more working components. Moreover, the present stacked assembly may be reliably interconnected without using solder. The particular embodiment shown in FIGS. 30-31 may be used to assemble together any of the packages shown in the present application. The present application may also incorporate any of the assembly shown in commonly assigned U.S. Pat. No. 6,177,636, the disclosure of which is hereby incorporated by reference herein.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending, commonly assigned U.S. patent application Ser. No. 10/985,126, filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. As disclosed in greater detail in the co-pending, commonly assigned U.S. patent application Ser. No. 10/985,119 filed Nov. 10, 2004, entitled "MICRO PIN GRID WITH PIN MOTION ISOLATION," the disclosure of which is also incorporated by reference herein, the flexible substrate may be provided with features to enhance the ability of the posts to move independently of one another and which enhance the tilting and wiping action.

As discussed in greater detail in the co-pending, commonly assigned U.S. Provisional Application 60/533,210 filed on or about even date herewith, entitled "MICROELECTRONIC PACKAGES AND METHODS THEREFOR", the disclosure of which is incorporated by reference herein, the support structure may include a plurality of spaced apart support elements and may also include a flexible sheet overlying the support elements. The conductive posts may be offset in horizontal directions from the support elements. The offset between the posts and the support elements allows the posts, and particular the bases of the posts, to move independently of one another relative to a microelectronic element.

As disclosed in greater detail in certain preferred embodiments of commonly assigned U.S. patent application Ser. No. 10/786,819 entitled "BALL GRID ARRAY WITH BUMPS" the disclosure of which is incorporated by reference herein, a semiconductor chip assembly includes a chip carrier having a dielectric layer and a electrically conductive terminals in the form of projecting bumps formed integrally with traces on the dielectric layer. The bumps have convex surfaces that are desirably hollow and deformable. The convex bottom ends of the bumps may be bonded to the contact pads on the surfaces of a circuit panel by a small amount of solder or other bonding material. The structure provides a sound joint between the contact pads and the bumps and avoids the need for relatively large solder balls. The assembly can be made using techniques well-integrated with the conventional surface-mounting techniques.

As disclosed in greater detail in certain preferred embodiments of co-pending, commonly assigned U.S. Provisional Application 60/508,970 entitled "FORMATION OF CIRCUITY WITH MODIFICATION OF FEATURE HEIGHT", the disclosure of which is hereby incorporated by reference herein, a connection component for mounting a chip or other microelectronic element is formed from a starting unit including posts projecting from a dielectric element by crushing or otherwise reducing the height of at least some of the posts.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
    a microelectronic element having faces and contacts, said microelectronic element having an outer perimeter;
    a flexible substrate overlying and spaced from a first face of said microelectronic element, wherein an outer region of said flexible substrate extends beyond the outer perimeter of said microelectronic element;
    a plurality of etched conductive posts having tips exposed at a surface of said flexible substrate, said etched conductive posts being electrically interconnected with said microelectronic element, wherein at least one of said conductive posts is disposed in the outer region of said flexible substrate;
    a compliant layer disposed between the first face of said microelectronic element and said flexible substrate, wherein said compliant layer overlies the at least one of said conductive posts that is disposed in the outer region of said flexible substrate, said compliant layer permitting movement of said conductive posts independently of each other in a direction relative to said microelectronic element; and
    an encapsulating mold material in contact with said microelectronic element and said compliant layer, wherein said encapsulating mold material overlies the outer region of said flexible substrate,
    such that pressing said plurality of conductive posts towards corresponding conductive elements of an external element establishes conductive contact between said tips of said plurality of conductive posts and said corresponding conductive elements by deforming said compliant layer to accommodate at least one of a difference in a height of said tips or a difference in a height of said corresponding conductive elements.

2. The package as claimed in claim 1, wherein said flexible substrate includes a dielectric material.

3. The package as claimed in claim 2, wherein said dielectric material includes a polymer.

4. The package as claimed in claim 1, wherein said first face is a front face of said microelectronic element and said contacts are accessible at said front face.

5. The package as claimed in claim 1, wherein said microelectronic element has a second face facing away from said flexible substrate, and wherein said contacts are accessible at said second face.

6. The package as claimed in claim 1, wherein said microelectronic element is operable to interchange signals at a frequency above about 300 MHz through at least some of said conductive posts.

7. The package as claimed in claim 1, further comprising conductive traces provided on said flexible substrate, wherein said conductive traces electrically interconnect at least some of said conductive posts with said microelectronic element.

8. The package as claimed in claim 7, wherein said flexible substrate has a first surface facing said microelectronic element and said conductive traces extend along the first surface of said flexible substrate.

9. The package as claimed in claim 7, wherein said flexible substrate has a second surface facing away from said microelectronic element and said conductive traces extend along the second surface of said flexible substrate.

10. The package as claimed in claim 1, wherein said contacts are spaced in a grid array over one of said faces of said microelectronic element.

11. The package as claimed in claim 1, wherein said contacts are disposed in one or more rows extending over one of said faces of said microelectronic element.

12. The package as claimed in claim 1, wherein said encapsulating mold material includes a rigid protective layer covering said microelectronic element and a first surface of said compliant layer facing away from said conductive posts.

13. The package as claimed in claim 12, wherein said rigid protective layer is made of a material selected from the group consisting of epoxies, glass and polymers.

14. The package as claimed in claim 12, wherein said flexible substrate extends beyond the outer edge of said compliant layer to define a gap and wherein said rigid protective layer fills the gap.

15. The package as claimed in claim 1, wherein said microelectronic element comprises a semiconductor chip.

16. A microelectronic assembly comprising a package as claimed in claim 1 and a circuit panel having contact pads, said conductive posts having tips remote from said flexible substrate confronting said contact pads and electrically connected thereto.

17. The assembly as claimed in claim 16, further comprising an electrically conductive bonding material securing said conductive posts to said contact pads.

18. The microelectronic package as claimed in claim 1, wherein said conductive posts extend through said flexible substrate.

19. The microelectronic package as claimed in claim 1, wherein said conductive posts have bases in contact with the surface of said flexible substrate.

20. The microelectronic package as claimed in claim 1, wherein said flexible substrate has an inner region that is aligned with said microelectronic element and at least one of said conductive posts is disposed within the inner region of said flexible substrate.

21. A microelectronic package comprising:
a microelectronic element having faces and contacts, said microelectronic element having an outer perimeter;
a flexible substrate overlying and spaced from a first face of said microelectronic element;
a plurality of conductive posts exposed at a surface of said flexible substrate and being electrically interconnected with said microelectronic element, said conductive posts having flat tips that are substantially coplanar with one another, at least one of said conductive posts being located in an outer region of said flexible substrate that extends beyond the outer perimeter of said microelectronic element;
a compliant layer disposed between the first face of said microelectronic element and said flexible substrate, wherein said compliant layer includes a section that overlies the at least one of said conductive posts located in the outer region of said flexible substrate, said compliant layer permitting movement of said conductive posts independently of each other in a direction relative to said microelectronic element; and
a protective layer in contact with said microelectronic element and the section of said compliant layer that overlies the at least one of said conductive posts located in the outer region of said flexible substrate,
such that pressing said plurality of conductive posts towards corresponding conductive elements of an external element establishes conductive contact between said tips of said plurality of conductive posts and said corresponding conductive elements by deforming said compliant layer to accommodate at least one of a difference in a height of said tips or a difference in a height of said corresponding conductive elements.

22. The package as claimed in claim 21, wherein said flexible substrate includes a dielectric sheet.

23. The package as claimed in claim 22, wherein said dielectric sheet includes a polymer.

24. The package as claimed in claim 21, wherein said flexible substrate includes conductive traces for electrically interconnecting said microelectronic element and said conductive posts.

25. The package as claimed in claim 24, wherein said flexible substrate has a first surface facing said microelectronic element and a second surface facing away from said microelectronic element.

26. The package as claimed in claim 25, wherein said conductive traces overly the first surface of said flexible substrate.

27. The package as claimed in claim 25, wherein said conductive traces overly the second surface of said flexible substrate.

28. The package as claimed in claim 21, wherein said microelectronic element has a first face facing toward said flexible substrate and a second face facing away from said flexible substrate.

29. The package as claimed in claim 28, wherein said contacts are accessible at said first face of said microelectronic element.

30. The package as claimed in claim 28, wherein said contacts are accessible at said second face of said microelectronic element.

31. The package as claimed in claim 30, further comprising wire bonds for electrically interconnecting said microelectronic element and said conductive posts.

32. The package as claimed in claim 21, wherein said microelectronic element comprises a semiconductor chip.

33. The microelectronic package as claimed in claim 21, wherein said conductive posts extend through said flexible substrate.

34. The microelectronic package as claimed in claim 21, wherein said conductive posts have bases in contact with the surface of said flexible substrate.

35. The microelectronic package as claimed in claim 21, wherein said flexible substrate has an inner region that is aligned with said microelectronic element and at least one of said conductive posts is disposed within the inner region of said flexible substrate.

36. A microelectronic package comprising:
   a microelectronic element having faces and contacts, said microelectronic element having an outer perimeter;
   a flexible substrate overlying and spaced from a first face of said microelectronic element, wherein an outer region of said flexible substrate extends beyond the outer perimeter of said microelectronic element;
   a plurality of etched conductive posts having tips exposed at a surface of said flexible substrate and being electrically interconnected with said microelectronic element, wherein at least one of said conductive posts is disposed in the outer region of said flexible substrate;
   a compliant layer disposed between the first face of said microelectronic element and said flexible substrate, wherein said compliant layer overlies the at least one of said conductive posts that is disposed in the outer region of said flexible substrate, said compliant layer permitting movement of said conductive posts independently of each other in a direction relative to said microelectronic element; and
   an encapsulating mold material serving as a rigid protective layer in contact with and covering said microelectronic element and said compliant layer,
   wherein said flexible substrate extends beyond the outer edge of said compliant layer to define a gap, and said encapsulating mold material overlies the outer region of said flexible substrate and fills the gap,
   such that pressing said plurality of conductive posts towards corresponding conductive elements of an external element establishes conductive contact between said tips of said plurality of conductive posts and said corresponding conductive elements by deforming said compliant layer to accommodate at least one of a difference in a height of said tips or a difference in a height of said corresponding conductive elements.

* * * * *